(12) United States Patent
Jun et al.

(10) Patent No.: US 10,153,331 B1
(45) Date of Patent: Dec. 11, 2018

(54) DISPLAY DEVICE

(71) Applicant: Samsung Display Co., Ltd., Yongin-si (KR)

(72) Inventors: Tae Jong Jun, Suwon-si (KR); Dae Ki Park, Seoul (KR); Jin Seob Byun, Seoul (KR); Woo Young Cheon, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/869,145

(22) Filed: Jan. 12, 2018

(30) Foreign Application Priority Data

Aug. 24, 2017 (KR) .......................... 10-2017-0107246

(51) Int. Cl.
| | |
|---|---|
| *H01L 27/32* | (2006.01) |
| *H01L 51/52* | (2006.01) |
| *G02F 1/1335* | (2006.01) |
| *H01L 51/00* | (2006.01) |
| *G02F 1/1368* | (2006.01) |

(52) U.S. Cl.
CPC .... *H01L 27/3218* (2013.01); *G02F 1/133512* (2013.01); *H01L 27/3272* (2013.01); *H01L 51/0096* (2013.01); *H01L 51/5284* (2013.01); *G02F 1/1368* (2013.01); *G02F 2201/52* (2013.01); *G02F 2201/56* (2013.01); *H01L 27/3206* (2013.01); *H01L 27/3211* (2013.01)

(58) Field of Classification Search
CPC ............. H01L 27/3206; H01L 27/3211; H01L 27/3213; H01L 27/3216; H01L 27/326; H01L 27/3218; H01L 27/3272; H01L 51/5284; H01L 51/0096; G02F 1/133512; G02F 2201/52; G02F 1/1368; G02F 2201/56
See application file for complete search history.

(56) References Cited

U.S. PATENT DOCUMENTS

| | | | |
|---|---|---|---|
| 8,345,209 B2 | 1/2013 | Fujita | |
| 2004/0046920 A1* | 3/2004 | Hayata | .................. G02F 1/1345 349/149 |

(Continued)

FOREIGN PATENT DOCUMENTS

| | | |
|---|---|---|
| JP | 5112961 | 1/2013 |
| KR | 10-2016-0081793 | 7/2016 |
| KR | 10-1652016 | 8/2016 |

*Primary Examiner* — Thanh T Nguyen
(74) *Attorney, Agent, or Firm* — H.C. Park & Associates, PLC

(57) ABSTRACT

A display device may include: a display area; a peripheral area disposed outside the display area and in which at least a part of a black matrix is disposed; and a plurality of pixel columns including: a first pixel column configured to display a first color, the first pixel column including a first boundary slope defined by a boundary line between the first pixel column and the black matrix; and a second pixel column disposed adjacent to the first pixel column, the second pixel column configured to display a second color different from the first color and including a second boundary slope defined by a boundary line between the second pixel column and the black matrix, wherein the first boundary slope may have a positive value, and the second boundary slope has a negative value.

20 Claims, 29 Drawing Sheets

(56) References Cited

U.S. PATENT DOCUMENTS

| | | | |
|---|---|---|---|
| 2011/0127536 A1* | 6/2011 | Yoshida | G02F 1/1362 257/59 |
| 2013/0099816 A1* | 4/2013 | Kawase | G09G 3/006 324/762.03 |
| 2015/0185513 A1* | 7/2015 | Wu | G02F 1/134363 257/72 |
| 2017/0077439 A1 | 3/2017 | Lee et al. | |
| 2017/0092182 A1* | 3/2017 | Fukami | G09G 3/2085 |

* cited by examiner

Prior Art

Prior Art

DISPLAY DEVICE

CROSS-REFERENCE TO RELATED APPLICATION

This application claims priority from and the benefit of Korean Patent Application No. 10-2017-0107246, filed on Aug. 24, 2017, which is hereby incorporated by reference for all purposes as if fully set forth herein.

BACKGROUND

Field

Exemplary embodiments relate to a display device.

Discussion of the Background

With the development of multimedia, display devices are becoming increasingly important. Accordingly, various types of display devices such as liquid crystal displays (LCDs) and organic light-emitting diode OLED displays are being used.

Of these display devices, LCDs are one of the most widely used types of flat panel displays. Generally, an LCD includes a pair of substrates having field generating electrodes, such as pixel electrodes and a common electrode, and a liquid crystal layer interposed between the two substrates. In the LCD, voltages are applied to the field generating electrodes to generate an electric field in the liquid crystal layer. Accordingly, the direction of liquid crystal molecules of the liquid crystal layer is determined, and the polarization of incident light is controlled. As a result, a desired image is displayed on the LCD using pixels arranged in rows and columns.

In addition, organic light-emitting diode OLED displays display an image using pixels with an organic light-emitting diode (OLED) that generates light through recombination of electrons and holes. Such organic light-emitting diode OLED displays have the advantages of fast response speed, high luminance, wide viewing angle, and low power consumption. However, an LED or OLED display with a curved edge such as a circular display may have a staircase effect at a boundary of the display area when perceived by a user.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a display device with a reduced staircase effect perceived.

Exemplary embodiments also provide a display device having a perceived shape being closer to a circular shape when perceived by a user.

Additional aspects will be set forth in the detailed description which follows, and, in part, will be apparent from the disclosure, or may be learned by practice of the inventive concept.

According to exemplary embodiments, a display device may include: a display area; a peripheral area disposed outside the display area and in which at least a part of a black matrix is disposed; and a plurality of pixel columns including: a first pixel column configured to display a first color, the first pixel column including a first boundary slope defined by a boundary line between the first pixel column and the black matrix; and a second pixel column disposed adjacent to the first pixel column, the second pixel column configured to display a second color different from the first color and including a second boundary slope defined by a boundary line between the second pixel column and the black matrix, wherein the first boundary slope may have a positive value, and the second boundary slope has a negative value.

The first color may be green.

The second color may be red.

A circular boundary line may be defined between the display area and the peripheral area, the first pixel column may include a first area disposed in the peripheral area, and the black matrix may not overlap at least a part of the first area.

The plurality of pixel columns may further include: a third pixel column configured to display a third color different from the first color and the second color, the third pixel column including a third boundary slope defined by a boundary line between the first pixel column and the black matrix, wherein the third pixel column may be disposed between the first pixel column and the second pixel column.

The third color may be blue.

The plurality of pixel columns may further include: a fourth pixel column configured to display the first color, and a fifth pixel column disposed adjacent to the fourth pixel column and configured to display the second color.

The fourth pixel column may include a fourth boundary slope defined by a boundary line between the fourth pixel column and the black matrix, and the fourth boundary slope may be different from the first boundary slope.

The fifth pixel column may include a fifth boundary slope defined by a boundary line between the fifth pixel column and the black matrix, and the fifth boundary slope may have a positive value.

Each of the plurality of pixel columns may include pixels disposed in a first direction, wherein each of the pixels may include: a first side extending in the first direction; and a second side extending in a second direction intersecting the first direction, and wherein the first side may be longer than the second side.

According to exemplary embodiments, a display device may include: a display area; a peripheral area disposed outside the display area and in which at least a part of a black matrix is disposed; and a plurality of pixel columns including: a first pixel column including a first boundary slope defined by a boundary line between the first pixel column and the black matrix; a second pixel column including a second boundary slope defined by a boundary line between the second pixel column and the black matrix; and a third pixel column including a third boundary slope defined by a boundary line between the third pixel column and the black matrix, wherein the first pixel column, the second pixel column, and the third pixel column may be disposed adjacent to each other and configured to different colors, wherein the first boundary slope, the second boundary slope, and the third boundary slope may be different from each other.

The first pixel column may be configured to display red, the second pixel column may be configured to display green, and the third pixel column may be configured to display blue.

The first boundary slope may have a negative value, and the second boundary slope may have a positive value.

An absolute value of the third boundary slope may be smaller than those of the first and second boundary slopes.

A circular boundary line may be defined between the display area and the peripheral area, the first pixel column may include a first area disposed in the peripheral area, and the black matrix may not overlap at least a part of the first area.

The second pixel column may include a second area disposed in the peripheral area, and the black matrix may not overlap at least a part of the second area.

The third pixel column may include a third area disposed in the peripheral area, and the black matrix may completely overlap the third area.

The third boundary slope may be substantially the same as a slope of the circular boundary line.

The plurality of pixel columns may further include: a fourth pixel column including a fourth boundary slope defined by a boundary line between the fourth pixel column and the black matrix; a fifth pixel column including a fifth boundary slope defined by a boundary line between the fifth pixel column and the black matrix; and a sixth pixel column including a sixth boundary slope defined by a boundary line between the sixth pixel column and the black matrix; wherein the fourth pixel column, the fifth pixel column, and the sixth pixel column may be disposed adjacent to the first pixel column, the second pixel column, and the third pixel column, and the fourth pixel column, the fifth pixel column, and the sixth pixel column are configured to display different colors, and wherein at least two of the fourth boundary slope, the fifth boundary slope, and the sixth boundary slope may be different from each other.

The fourth pixel column may be configured to display red, wherein the first boundary slope may have a negative value, and wherein the fourth boundary slope may have a positive value.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

DETAILED DESCRIPTION OF THE ILLUSTRATED EMBODIMENTS

Figure 1:
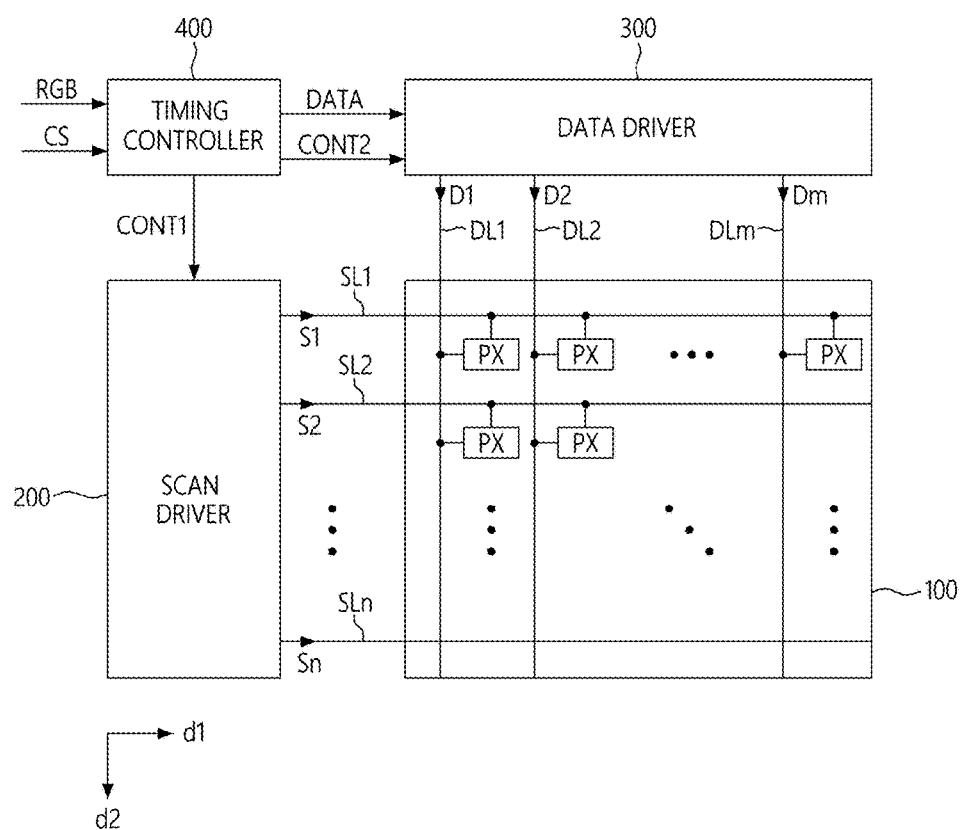
FIG. 1 is a schematic block diagram of a display device according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

In the accompanying figures, the size and relative sizes of layers, films, panels, regions, etc., may be exaggerated for clarity and descriptive purposes. Also, like reference numerals denote like elements. Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the d1-axis, the d2-axis, and the d3-axis are not limited to three axes of a rectangular coordinate system, such as the x, y, and z-axes, and may be interpreted in a broader sense. For example, the d1-axis, the d2-axis, and the d3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, embodiments of the inventive concept will be described with reference to the attached drawings.

FIG. 1 is a schematic block diagram of a display device according to an exemplary embodiment.

Referring to FIG. 1, the display device according to the exemplary embodiment may include a display unit 100, a scan driver 200, a data driver 300, and a timing controller 400.

The display unit 100 is an area for displaying an image. A plurality of pixels PX may be arranged in the display unit 100. The pixels PX may be electrically connected to first through $n^{th}$ scan lines SL through SLn (where n is a natural number of 1 or greater) extending in a first direction d1. In addition, the pixels PX may be electrically connected to first to $m^{th}$ data lines DL1 through DLm (where m is a natural number of 1 or greater) extending in a second direction d2. Here, the first direction d1 may intersect the second direction d2. Based on FIG. 1, the first direction d1 may be defined as a row direction, and the second direction d2 may be defined as a column direction. That is, the pixels PX may be disposed in pixel areas defined by the first through the $n^{th}$ scan lines SL1 through SLn and the first through $m^{th}$ data lines DL1 through DLm, respectively.

The scan driver 200 may be electrically connected to the pixels PX by the first through $n^{th}$ scan lines SL1 through SLn. More specifically, the scan driver 200 may generate first through $n^{th}$ scan signals S1 through Sn and provide the generated first through $n^{th}$ scan signals S1 through Sn to the pixels PX through the first through $n^{th}$ scan lines SL1 through SLn. Here, the scan driver 200 may generate the first through $n^{th}$ scan signals S1 through Sn based on a first control signal CONT1 received from the timing controller 400. In an exemplary embodiment, the scan driver 200 may include a plurality of transistors that generate the first through the $n^{th}$ scan signals S1 through Sn. In an exemplary embodiment, the scan driver 200 may include an integrated circuit that generates the first through the $n^h$ scan signals S1 through Sn.

The data driver 300 may be electrically connected to the pixels PX by the first through $m^{th}$ data lines DL1 through DLm. More specifically, the data driver 300 may generate first through $m^h$ data signals D1 through Dm and provide the generated first through $m^{th}$ data signals D1 through Dm to the pixels PX through the first through $m^t$ data lines DL1 through DLm. The data driver 300 may include a shift register, a latch, and a digital-analog converter in an exemplary embodiment.

The data driver 300 may receive a second control signal CONT2 and image data DATA from the timing controller 400. In an exemplary embodiment, the data driver 300 may convert the image data DATA in a digital waveform into the first through $m^{th}$ data signals D1 through Dm in an analog form based on the second control signal CONT2. The data driver 300 may provide the first through the $m^{th}$ data signals D1 through Dm to pixels selected by the first through $n^{th}$ scan signals S1 through Sn from among the pixels PX.

The timing controller 400 may receive an image signal RGB and a control signal CS from an external source. The image signal RGB may include a plurality of gray data corresponding to data signals to be provided to the pixels PX. The control signal CS may include a vertical synchronization signal, a horizontal synchronization signal, a main clock signal, and a data enable signal in an exemplary embodiment. The timing controller 400 may process signals received from the external source according to the operating conditions of the display unit 100 and then generate the image data DATA, the first control signal CONT1 and the second control signal CONT2.

The timing controller 400 may provide the generated first control signal CONT1 to the scan driver 200. The first control signal CONT1 may include a scan start signal for instructing the start of output of the first through $n^{th}$ scan signals S1 through Sn and a gate clock signal for controlling the output timing of a scan on pulse. In addition, the timing controller 400 may provide the generated second control signal CONT2 to the data driver 300. The second control signal CONT2 may include a horizontal synchronization start signal for instructing the start of input of the image data DATA and a load signal for controlling the transmission of the first through $m^{th}$ data signals D1 through Dm.

The pixels PX will now be described in more detail. For ease of description, a pixel electrically connected to the first scan line SL1 and the first data line DL1 among the pixels PX will be referred to as a first pixel PX11.

The scan driver 200, the data driver 300, and the timing controller 400 are not limited the above. In exemplary embodiments, the scan driver 200, the data driver 300, and the timing controller 400, and/or one or more components thereof, may be implemented via one or more general purpose and/or special purpose components, such as one or more discrete circuits, digital signal processing chips, integrated circuits, application specific integrated circuits, microprocessors, processors, programmable arrays, field programmable arrays, instruction set processors, and/or the like.

According to exemplary embodiments, the features, functions, processes, etc., described herein may be implemented via software, hardware (e.g., general processor, digital signal processing (DSP) chip, an application specific integrated circuit (ASIC), field programmable gate arrays (FPGAs), etc.), firmware, or a combination thereof. In this manner, the scan driver 200, the data driver 300, and the timing controller 400, and/or one or more components thereof may include or otherwise be associated with one or more memories (not shown) including code (e.g., instructions) configured to cause the scan driver 200, the data driver 300, and the timing controller 400, and/or one or more components thereof to perform one or more of the features, functions, processes, etc., described herein.

The memories may be any medium that participates in providing code to the one or more software, hardware, and/or firmware components for execution. Such memories may be implemented in any suitable form, including, but not limited to, non-volatile media, volatile media, and transmission media. Non-volatile media include, for example, optical or magnetic disks. Volatile media include dynamic memory. Transmission media include coaxial cables, copper wire and fiber optics. Transmission media can also take the form of acoustic, optical, or electromagnetic waves. Common forms of computer-readable media include, for example, a floppy disk, a flexible disk, hard disk, magnetic tape, any other magnetic medium, a compact disk-read only memory (CD-ROM), a rewriteable compact disk (CDRW), a digital video disk (DVD), a rewriteable DVD (DVD-RW), any other optical medium, punch cards, paper tape, optical mark sheets, any other physical medium with patterns of holes or other optically recognizable indicia, a random-access memory (RAM), a programmable read only memory (PROM), and erasable programmable read only memory (EPROM), a FLASH-EPROM, any other memory chip or cartridge, a carrier wave, or any other medium from which information may be read by, for example, a controller/processor.

Figure 2:
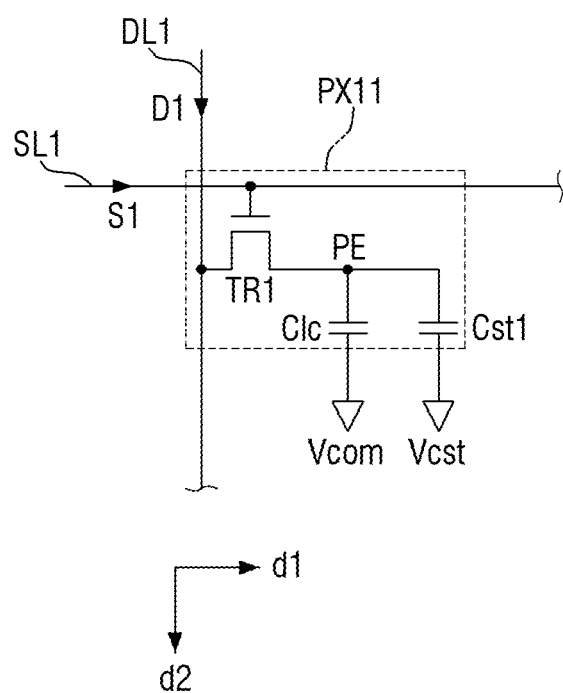
FIG. 2 is an equivalent circuit diagram of an exemplary embodiment of a first pixel illustrated in FIG. 1

FIG. 2 is an equivalent circuit diagram of the first pixel PX11 illustrated in FIG. 1, according to an exemplary embodiment.

Referring to FIG. 2, the first pixel PX11 may include a switching element TR1, a pixel electrode PE, a liquid crystal capacitor Clc, and a first storage capacitor Cst1.

The switching element TR1 may be connected to the first scan line SL, the first data line DL1, and the pixel electrode PE. The switching element TR1 may be a three-terminal element such as a thin-film transistor in an exemplary embodiment. The switching element TR1 will hereinafter be described as a thin-film transistor. The switching element TR1 may have a gate electrode connected to the first scan line SL1 and a source electrode connected to the first data line DL1. A drain electrode of the switching element TR1 may be connected to the pixel electrode PE. The switching element TR1 may be turned on in response to the first scan signal S1 received from the first scan line SL1 and provide the first data signal D1 received from the first data line DL1 to the pixel electrode PE.

The pixel electrode PE may be capacitively coupled to a common electrode provided with a common voltage Vcom. Accordingly, the liquid crystal capacitor Clc may be formed between the pixel electrode PE and the common electrode. That is, when the display unit 100 illustrated in FIG. 1 includes the first pixel PX11 illustrated in FIG. 2, the display device according to the exemplary embodiment may be a liquid crystal display (LCD).

The first storage capacitor Cst1 may have an electrode electrically connected to the pixel electrode PE and the other electrode electrically connected to a storage electrode provided with a storage voltage Vcst.

The first pixel PX11 is not limited to the one illustrated in FIG. 2. In an exemplary embodiment, the first pixel PX11 may include a plurality of switching elements for improving visibility in addition to the switching element TR1.

Figure 3:
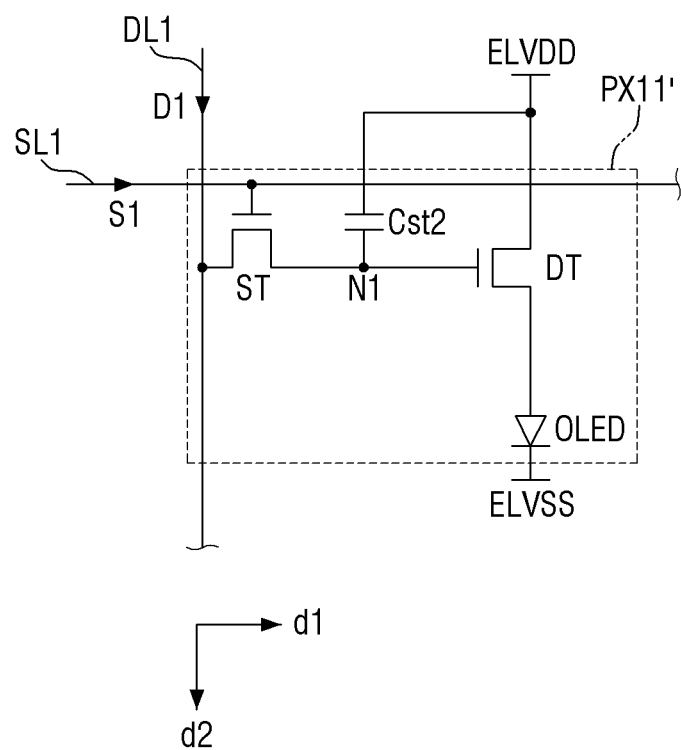
FIG. 3 is an equivalent circuit diagram of an exemplary embodiment of the first pixel illustrated in FIG. 1.

FIG. 3 is an equivalent circuit diagram of an exemplary embodiment of the first pixel PX11 illustrated in FIG. 1. For simplicity, a description of elements and features identical to those described above with reference to FIG. 2 will be omitted. In FIG. 3, the first pixel PX11 will be indicated by PX11'.

Referring to FIG. 3, the first pixel PX11' may include a first switching element ST, a second switching element DT, a second storage capacitor Cst2, and an organic light-emitting diode OLED. That is, when the display unit 100 illustrated in FIG. 1 includes the first pixel PX11' illustrated in FIG. 3, the display device according to the exemplary embodiment may be an organic light-emitting diode OLED display. In this case, the display device illustrated in FIG. 1 may further include a power supply unit that provides a first driving voltage ELVDD and a second driving voltage ELVSS to the display unit 100.

The first switching element ST may include a source electrode electrically connected to the first data line DL1, a drain electrode electrically connected to a first node N1, and a gate electrode electrically connected to the first scan line SL1. Here, the first node N1 may be electrically connected to a gate electrode of the second switching device DT and an electrode of the second storage capacitor Cst2. The first switching element ST may be turned on in response to the first scan signal S1 received from the first scan line SL1 and provide the first data signal D1 received from the first data line DL1 to the first node N1.

The second storage capacitor Cst2 may include a first end electrically connected to the first node N1 and a second end provided with the first driving voltage ELVDD. The second storage capacitor Cst2 may be charged with a voltage corresponding to a difference in voltage level between a voltage provided to the first node N1 and the first driving voltage ELVDD.

The second switching element DT may include a source electrode provided with the first driving voltage ELVDD, a drain electrode electrically connected to an end of the organic light-emitting diode OLED, and the gate electrode electrically connected to the first node N1. Thus, the second switching element DT can adjust a driving current supplied to the organic light-emitting diode OLED based on a voltage applied to the gate electrode.

The organic light-emitting diode OLED may emit light of a predetermined color based on the driving current. Here, the predetermined color may be one of red, green, and blue in an exemplary embodiment. The organic light-emitting diode OLED may include a low or high molecular organic material corresponding to the color of light emitted. In an exemplary embodiment, the organic light-emitting diode OLED may emit white light. When emitting white light, the organic light-emitting diode OLED may have a stacked structure of red, green, and blue light emitting layers in an exemplary embodiment.

The first pixel PX11' is not limited to the one illustrated in FIG. 3. In an exemplary embodiment, the first pixel PX11' may include a plurality of switching elements for compensating for a threshold voltage of the second switching element DT, in addition to the first switching element ST and the second switching element DT.

The display device according to the exemplary embodiment will hereinafter be described as an LCD.

Figure 4:
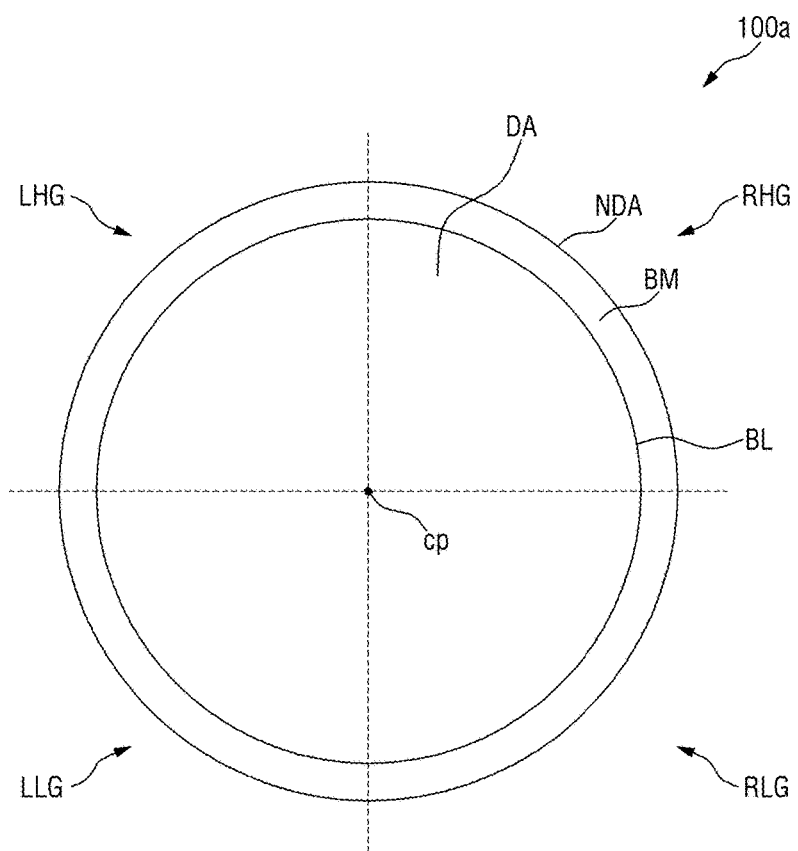
FIG. 4 is a schematic plan view of an exemplary embodiment of a display unit illustrated in FIG. 1.

FIG. 4 is a schematic plan view of an exemplary embodiment of the display unit 100 illustrated in FIG. 1.

A display unit 100*a* may include a display area DA and a peripheral area NDA.

The display area DA is defined as an area in which an image is displayed. The display area DA may have a generally round shape in an exemplary embodiment. Here, examples of the round shape may include a circular shape, an elliptical shape, and a substantially circular shape. The peripheral area NDA is defined as an area in which a black matrix BM is disposed. Here, a black matrix disposed in areas where circuit elements disposed in the display area DA are located is excluded from the black matrix BM. The peripheral area NDA may surround the display area DA in an exemplary embodiment. Accordingly, the peripheral area NDA may have a round shape corresponding to the shape of the display area DA.

The display area DA may be divided into an upper left area LHG, an upper right area RHG, a lower left area LLG and a lower right area RLG by an imaginary center lines crossing at a right angle at a center point cp. An imaginary boundary line BL may overlap both the display area DA and the peripheral area NDA. That is, the imaginary boundary line BL may overlap the display area DA where colors are displayed and the peripheral area NDA where at least part of the black matrix BM is disposed. A black matrix overlapping circuit regions of the pixels PX located in the display area DA is excluded from the black matrix BM used herein.

In the display device according to the exemplary embodiment, an area for displaying a color may be located not only in the display area DA but also in part of the peripheral area NDA. This will be described later.

Unlike in FIG. 4, the peripheral area NDA can have a quadrilateral shape. In addition, the shape of the display area DA can be different from the shape of the peripheral area NDA.

Figure 5:
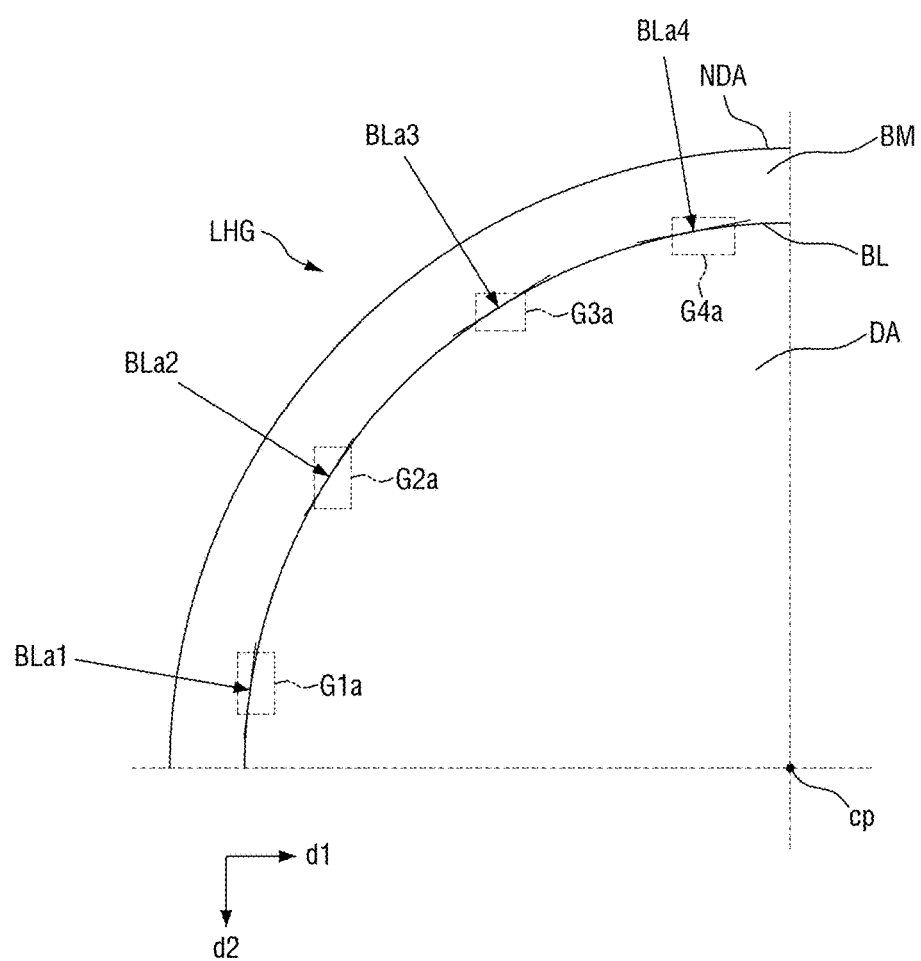
FIG. 5 is an enlarged view of an upper left area illustrated in FIG. 4.

FIG. 5 is an enlarged view of the upper left area LHG illustrated in FIG. 4.

Referring to FIG. 5, the upper left area LHG may include first, second, third, and fourth areas G1*a*, G2*a*, G3*a*, and G4*a*. The first, second, third, and fourth areas G1*a*, G2*a*, G3*a*, and G4*a* are defined as areas arranged sequentially along the first direction d1 and overlapping the imaginary boundary line BL.

The slope of a tangent line to the imaginary boundary line BL may be different in each of the first, second, third, and fourth areas G1*a*, G2*a*, G3*a*, and G4*a*. More specifically, the slope of the tangent line to the imaginary boundary line BL decreases along the first direction d1. This will be described using the first, second, third, and fourth areas G1*a*, G2*a*, G3*a*, and G4*a* as an example.

A slope BLa2 of a tangent line to the imaginary boundary line BL located in the second area G2*a* is smaller than a slope BLa1 of a tangent line to the imaginary boundary line BL located in the first area G1*a*. In addition, a slope BLa3 of a tangent line to the imaginary boundary line BL located in the third area G3*a* is smaller than the slope BLa2 of the tangent line to the imaginary boundary line BL located in the second area G2*a*. A slope BLa4 of a tangent line to the imaginary boundary line BL located in the fourth area G4*a* is larger than the slope BLa3 of the tangent line to the imaginary boundary line BL located in the third area G3*a*.

That is, of the slopes BLa1, BLa2, BLa3 and BLa4 of the tangent lines disposed in the first, second, third, and fourth areas G1*a*, G2*a*, G3*a*, and G4*a*, the slope Bla1 of the tangent line to the imaginary boundary line BL located in the first area G1*a* is largest, and the slope BLa4 of the tangent line to the imaginary boundary line BL located in the fourth area G4*a* is smallest.

The positions of the first, second, third, and fourth areas G1*a*, G2*a*, G3*a*, and G4*a* are not necessarily limited to those illustrated in FIG. 5 as long as magnitude conditions between the slopes BLa1, BLa2, BLa3 and BLa4 of the tangent lines disposed in the first, second, third, and fourth areas G1*a*, G2*a*, G3*a*, and G4*a* are satisfied.

Each of the pixels PX (see FIG. 1) may display one of first through third colors which are different from each other. The first color may be red in an exemplary embodiment, and the second color may be green in an exemplary embodiment. Also, the third color may be blue in an exemplary embodiment. However, the inventive concept is not limited to the above case, and the pixels PX can also display one of white, cyan, magenta, and yellow. A case where each of the pixels PX displays one of red, green and blue will hereinafter be described as an example. In addition, a case where pixels displaying red, green, and blue are sequentially arranged along the first direction d1 will be described as an example.

In a conventional display device having a circular display area, a staircase effect occurs at a boundary between the display area and a peripheral area. Therefore, the display area is not perceived as being circular by a user.

In the display device according to the exemplary embodiment, however, each pixel column may be formed to have a different boundary slope in consideration of the display color, the slope of a tangent line to the imaginary boundary line BL, and the contribution of each display color to luminance. Therefore, the display device according to the exemplary embodiment can realize an ideal or improved perceived curvature perceived by a user, so that the circular display area DA can be perceived as being circular by the user. That is, the ideal or improved perceived curvature is defined as a curvature that enables a user to perceive the circular display area DA as being circular.

With reference to FIGS. 6, 7, 8, and 9, the boundary slope of each pixel column will first be defined based on pixel columns overlapping the first, second, third, and fourth areas G1a, G2a, G3a, and G4a.

Figure 6:
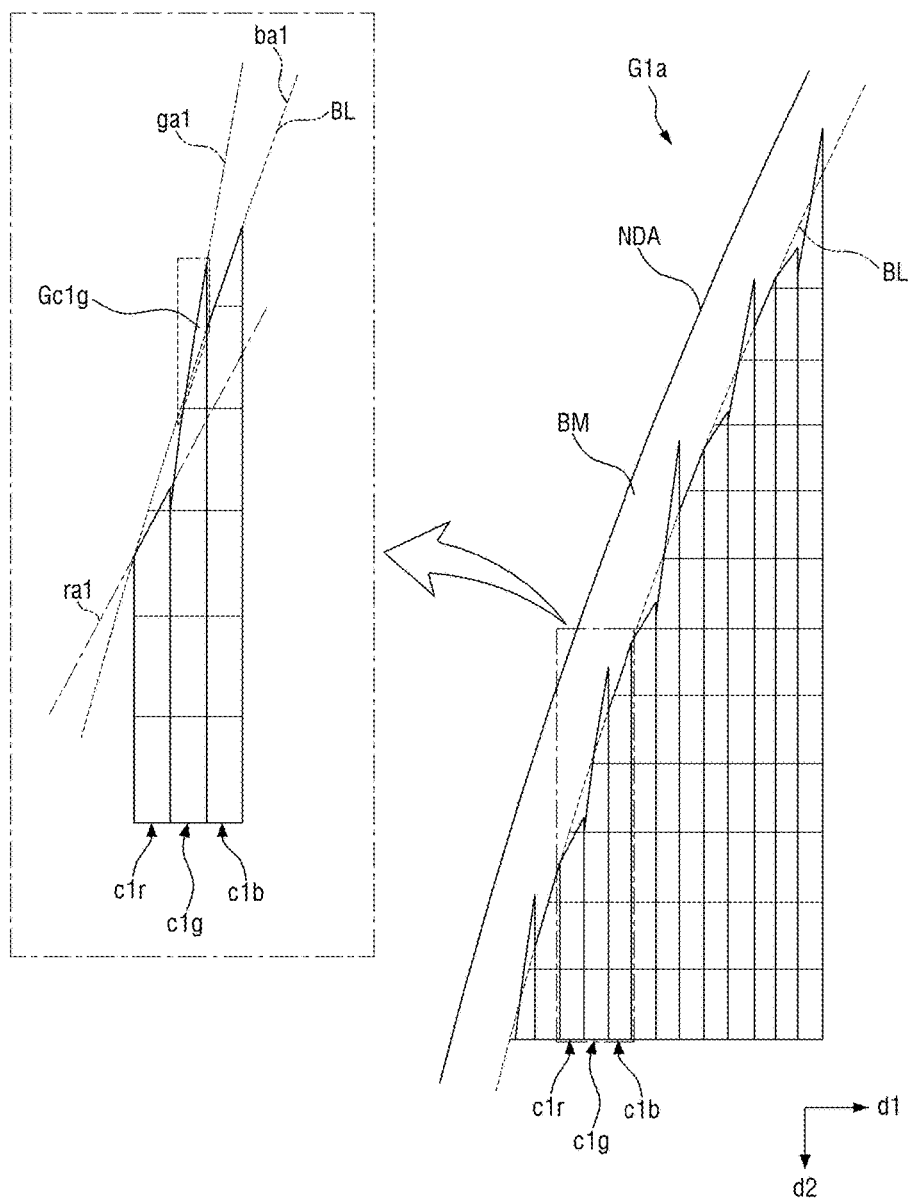
FIG. 6 is an enlarged view of a first area illustrated in FIG. 5.
Figure 7:
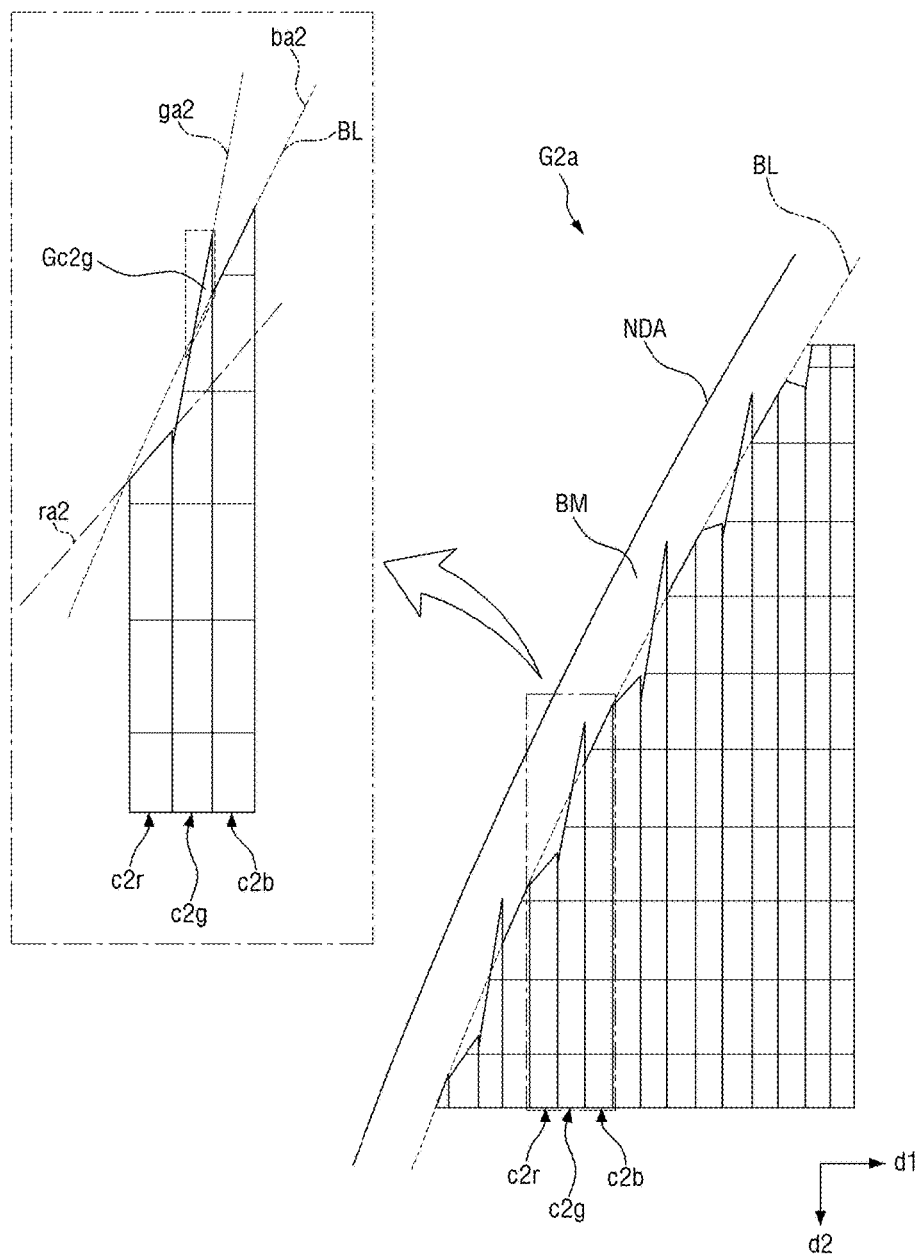
FIG. 7 is an enlarged view of a second area illustrated in FIG. 5.
Figure 8:
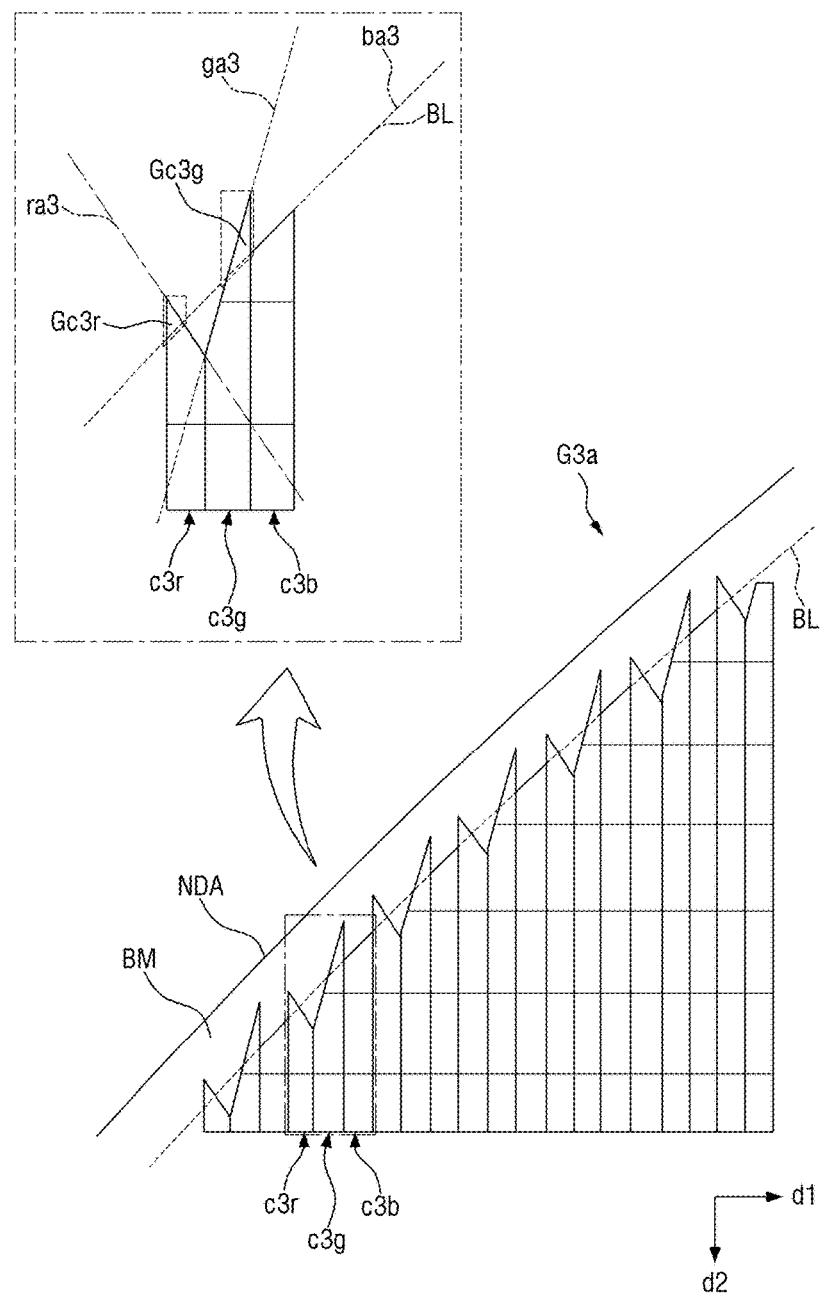
FIG. 8 is an enlarged view of a third area illustrated in FIG. 5.
Figure 9:
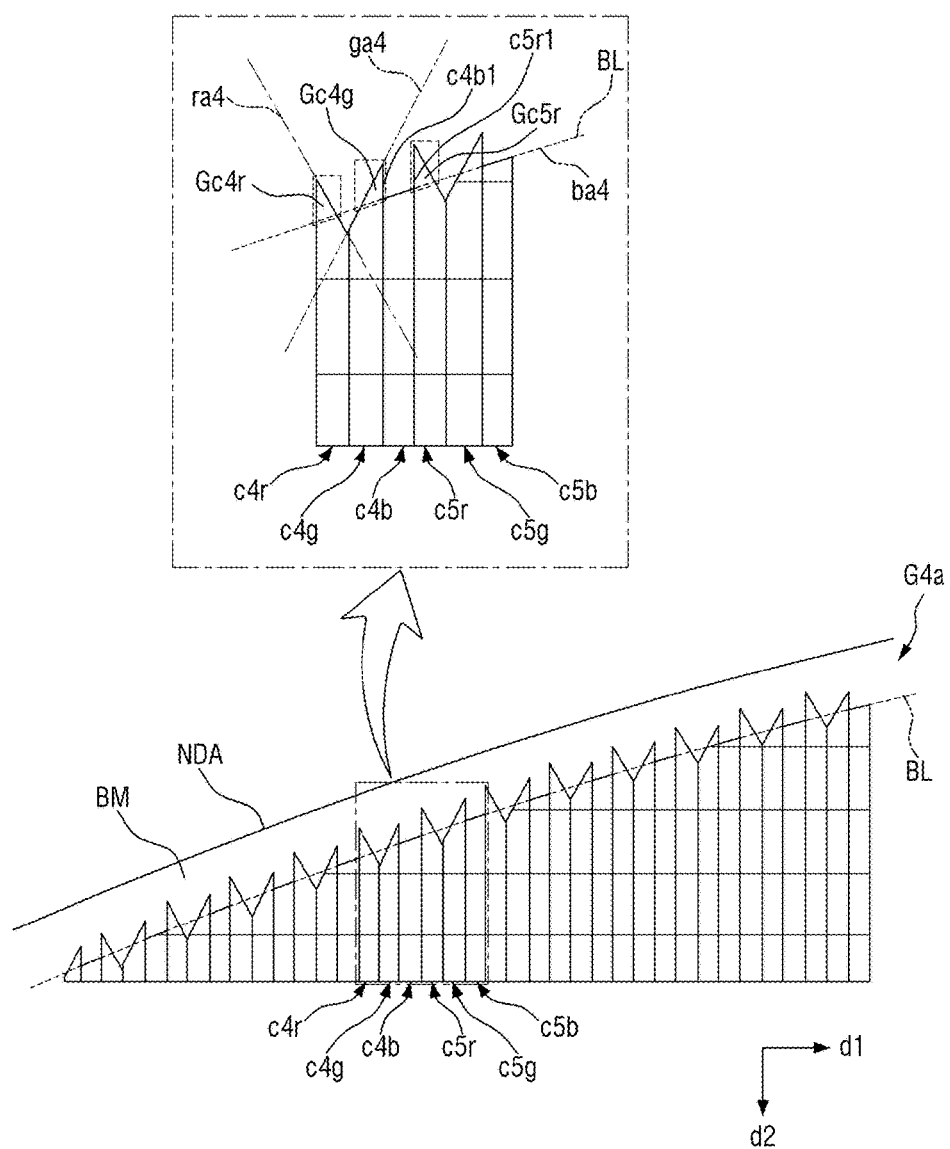
FIG. 9 is an enlarged view of a fourth area illustrated in FIG. 5.

FIG. 6 is an enlarged view of the first area G1a illustrated in FIG. 5. FIG. 7 is an enlarged view of the second area G2a illustrated in FIG. 5. FIG. 8 is an enlarged view of the third area G3a illustrated in FIG. 5. FIG. 9 is an enlarged view of the fourth area G4a illustrated in FIG. 5.

With reference to FIG. 6, the first area G1a will be described based on a first red to pixel column c1r, a first green pixel column c1g and a first blue pixel column c1b which overlap the first area G1a.

A plurality of pixels included in the first red pixel column c1r may all display red color. A plurality of pixels included in the first green pixel column c1g may all display green color, and a plurality of pixels included in the first blue pixel column c1b may all display blue color. The first red pixel column c1r, the first green pixel column c1g, and the first blue pixel column c b may neighbor each other.

A first red boundary slope ra1 is defined as the slope of a boundary line between the first red pixel column c1r and the black matrix BM. A first green boundary slope ga1 is defined as the slope of a boundary line between the first green pixel column c1g and the black matrix BM. Similarly, a first blue boundary slope ba1 is defined as the slope of a boundary line between the first blue pixel column c1b and the black matrix BM. The first red boundary slope ra1, the first green boundary slope ga1, and the first blue boundary slope ba1 may be formed different from each other in an exemplary embodiment.

With reference to FIG. 7, the second area G2a will be described based on a second red pixel column c2r, a second green pixel column c2g and a second blue pixel column c2b which overlap the second area G2a. For simplicity, a description of elements and features identical to those described above will be omitted.

A second red boundary slope ra2 is defined as the slope of a boundary line between the second red pixel column c2r and the black matrix BM. A second green boundary slope ga2 is defined as the slope of a boundary line between the second green pixel column c2g and the black matrix BM. Similarly, a second blue boundary slope ba2 is defined as the slope of a boundary line between the second blue pixel column c2b and the black matrix BM. The second red boundary slope ra2, the second green boundary slope ga2, and the second blue boundary slope ba2 may be formed different from each other in an exemplary embodiment.

With reference to FIG. 8, the third area G3a will be described based on a third red pixel column c3r, a third green pixel column c3g and a third blue pixel column c3b which overlap the third area G3a. For simplicity, a description of elements and features identical to those described above will be omitted.

A third red boundary slope ra3 is defined as the slope of a boundary line between the third red pixel column c3r and the black matrix BM. A third green boundary slope ga3 is defined as the slope of a boundary line between the third green pixel column c3g and the black matrix BM. Similarly, a third blue boundary slope ba3 is defined as the slope of a boundary line between the third blue pixel column c3b and the black matrix BM. The third red boundary slope ra3, the third green boundary slope ga3 and the third blue boundary slope ba3 may be formed different from each other in an exemplary embodiment.

With reference to FIG. 9, the fourth area G4a will be described based on a fourth red pixel column c4r, a fourth green pixel column c4g and a fourth blue pixel column c4b which overlap the fourth area G4a. For simplicity, a description of elements and features identical to those described above will be omitted.

A fourth red boundary slope ra4 is defined as the slope of a boundary line between the fourth red pixel column c4r and the black matrix BM. A fourth green boundary slope ga4 is defined as the slope of a boundary line between the fourth green pixel column c4g and the black matrix BM. Similarly, a fourth blue boundary slope ba4 is defined as the slope of a boundary line between the fourth blue pixel column c4b and the black matrix BM. The fourth red boundary slope ra4, the fourth green boundary slope ga4, and the fourth blue boundary slope ba4 may be formed different from each other in an exemplary embodiment.

As described above, in the display device according to the exemplary embodiment, each pixel column may be formed to have a different boundary slope in consideration of each of the display color, the slope of a tangent line to the imaginary boundary line BL, and the contribution of each display color to luminance. Therefore, the display device according to the exemplary embodiment can realize an ideal or improved perceived curvature perceived by the user.

The boundary slope of each pixel column for realizing an ideal or improved perceived curvature will hereinafter be described with reference to FIGS. 6 through 12.

Figure 10:
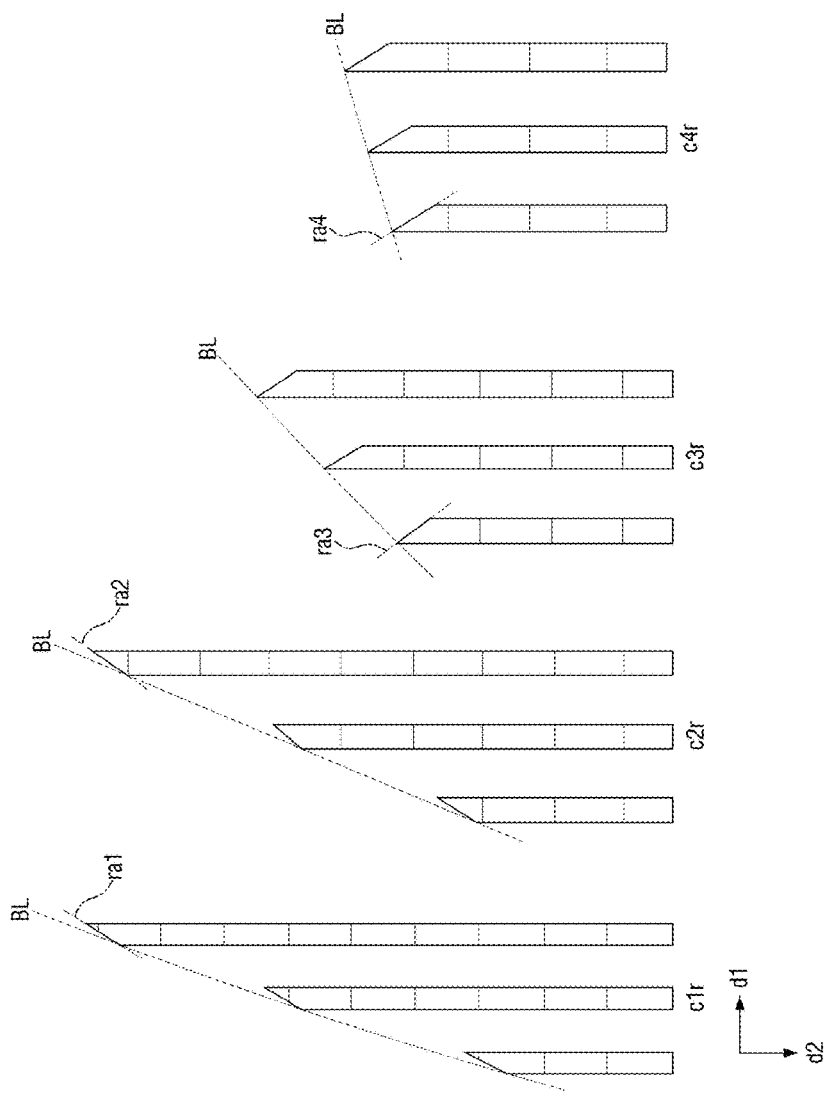
FIG. 10 illustrates red pixel columns among pixel columns arranged in the first, second, third, and fourth areas of FIGS. 6, 7, 8, and 9.
Figure 11:
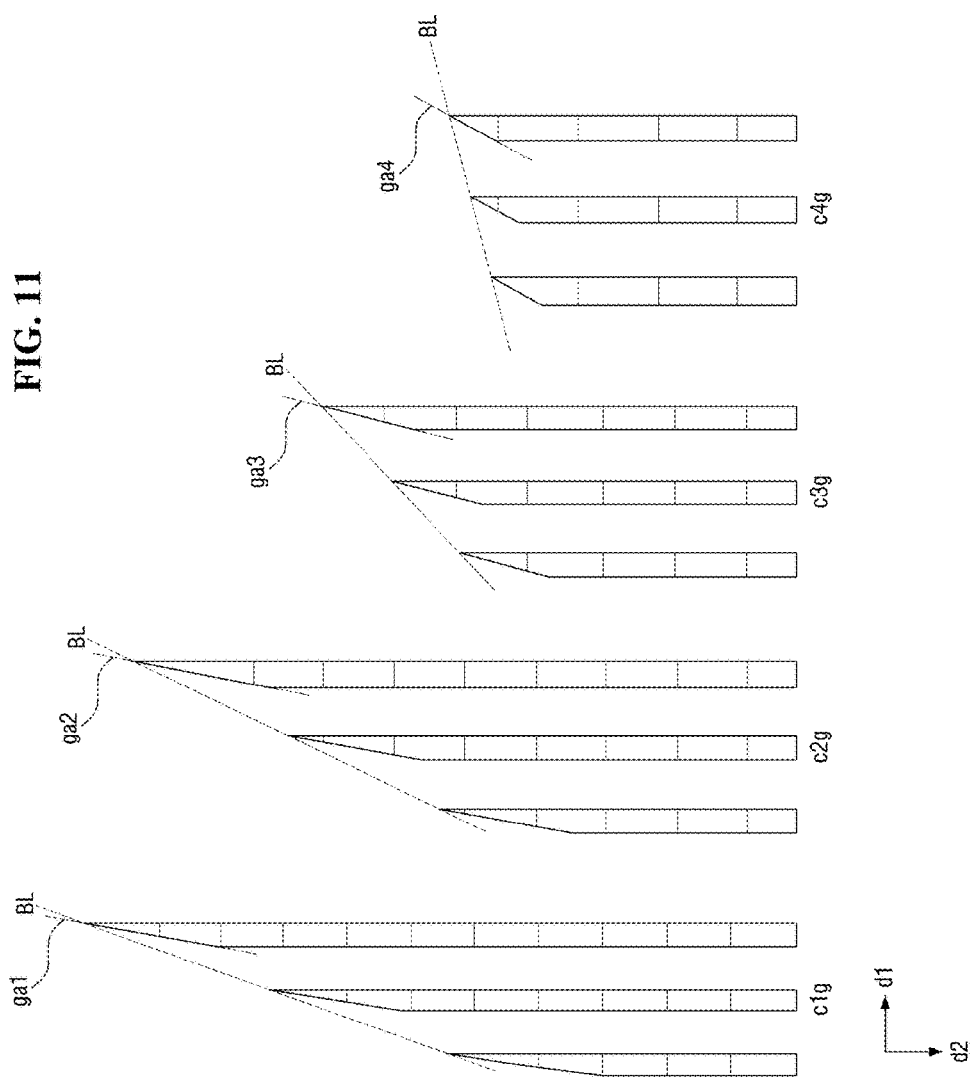
FIG. 11 illustrates green pixel columns among the pixel columns arranged in the first, second, third, and fourth areas of FIGS. 6, 7, 8, and 9.
Figure 12:
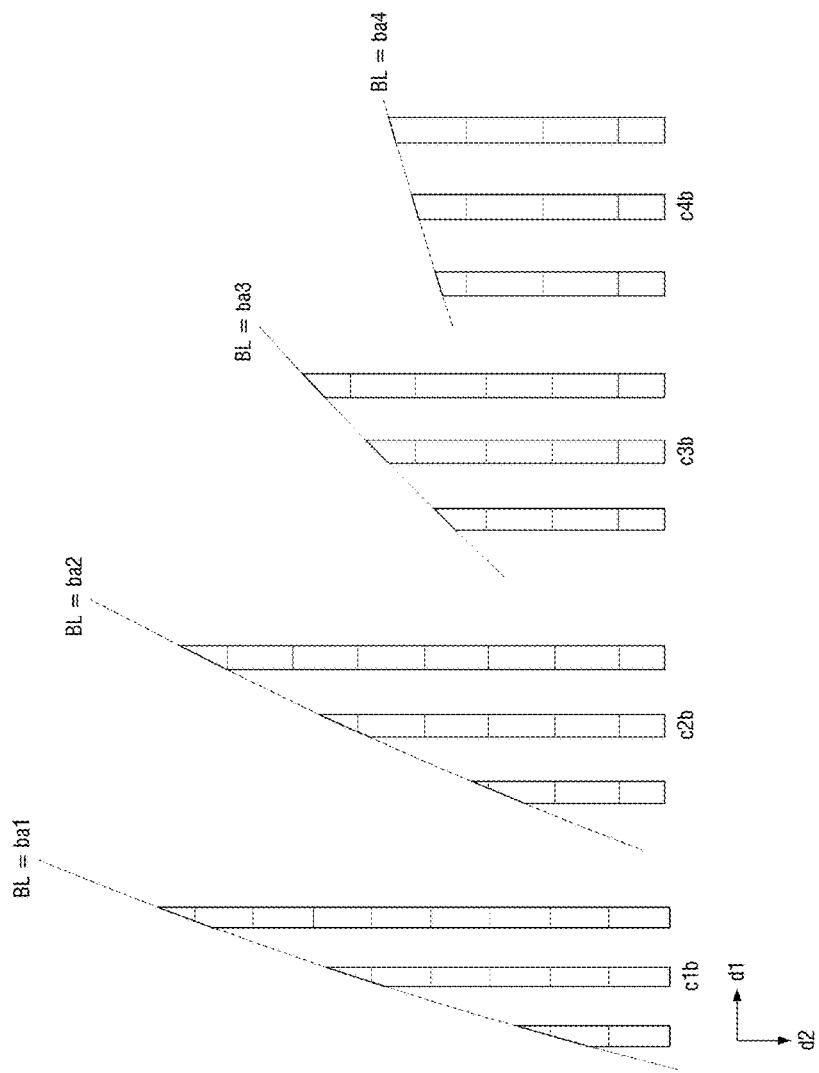
FIG. 12 illustrates blue pixel columns among the pixel columns arranged in the first, second, third, and fourth areas of FIGS. 6, 7, 8, and 9.

FIG. 10 illustrates red pixel columns c1r, c2r, c3r, and c4r among pixel columns arranged in the first, second, third, and fourth areas G1a, G2a, G3a, and G4a of FIGS. 6, 7, 8, and 9. FIG. 11 illustrates green pixel columns c1g, c2g, c3g, and c4g among the pixel columns arranged in the first, second, third, and fourth areas G1a, G2a, G3a, and G4a of FIGS. 6, 7, 8, and 9. FIG. 12 illustrates blue pixel columns among the pixel columns c1b, c2b, c3b, and c4b arranged in the first, second, third, and fourth areas G1a, G2a, G3a, and G4a of FIGS. 6, 7, 8, and 9.

In the upper left area LHG, the slopes of tangent lines to the imaginary boundary line BL decrease along the first direction d1, that is, from the first area G1a toward the fourth area G4a. Particularly, the black matrix may be formed to completely cover the parts of the first, second, third, and fourth blue pixel columns c1b, c2b, c3b, and c4b that are disposed in the peripheral area NDA.

In the case of the red pixel columns disposed in the upper left area LHG, as the slopes of the tangent lines to the imaginary boundary line BL decrease, the slopes of the boundary lines between the red pixel columns and the black matrix BM also decrease.

In the case of the green pixel columns disposed in the upper left area LHG, as the slopes of the tangent lines to the imaginary boundary line BL decrease, the slopes of the boundary lines between the green pixel columns and the black matrix BM decrease.

In the case of the blue pixel columns disposed in the upper left area LHG, the slopes of the boundary lines between the blue pixel columns and the black matrix BM may be substantially equal to the slopes of the tangent lines to the imaginary boundary line BL.

The slopes of the boundary lines between the green pixel columns and the black matrix BM will first be described with reference to FIGS. 6, 7, 8, 9, and 11.

Referring to FIGS. 6, 7, 8, 9, and 11, in the case of the green pixel columns displaying green among a plurality of pixels arranged in the upper left area LHG, the slopes of the boundary lines between the green pixel columns and the black matrix BM decrease along the first direction d1.

For example, the second green boundary slope ga2 in the second area G2a is smaller than the first green boundary slope ga1 in the first area G1a. In addition, the third green boundary slope ga3 in the third area G3a is smaller than the second green boundary slope ga2 in the second area G2a. Further, the fourth green boundary slope ga4 in the fourth area G4a is smaller than the third green boundary slope ga3 in the third area G3a.

That is, since the slopes of the tangent lines to the imaginary boundary line BL decreases along the first direction d1, the slopes of the boundary lines between the green pixel columns and the black matrix BM also decrease along the first direction d1 in proportion to the slopes of the tangent lines to the imaginary boundary line BL. That is, an ideal or improved perceived curvature can be realized by adjusting the slopes of the boundary lines between the green pixel columns and the black matrix BM.

The green pixel columns disposed in the upper left area LHG may include a plurality of reinforcing areas to adjust the slopes of the boundary lines between the green pixel columns and the black matrix BM.

More specifically, the green pixel columns displaying green among the pixels arranged in the upper left area LHG may include a plurality of reinforcing areas. For example, the first green pixel column c1g may include a first reinforcing area Gc1g disposed outside the display area DA (i.e., in the peripheral area NDA) with respect to the imaginary boundary line BL. The first reinforcing area Gc1g is disposed in the peripheral area NDA but is not covered by the black matrix BM. Thus, the first reinforcing area Gc1g can display green color.

The second green pixel column c2g may include a second reinforcing area Gc2g disposed outside the display area DA (i.e., in the peripheral area NDA) with respect to the imaginary boundary line BL. The second reinforcing area Gc2g is disposed in the peripheral area NDA but is not covered by the black matrix BM. Thus, the second reinforcing area Gc2g can display green color.

The third green pixel column c3g may include a third reinforcing area Gc3g disposed outside the display area DA (i.e., in the peripheral area NDA) with respect to the imaginary boundary line BL. The third reinforcing area Gc3g is disposed in the peripheral area NDA but is not covered by the black matrix BM. Thus, the third reinforcing area Gc3g can display green color.

The fourth green pixel column c4g may include a fourth reinforcing area Gc4g disposed outside the display area DA (i.e., in the peripheral area NDA) with respect to the imaginary boundary line BL. The fourth reinforcing area Gc4g is disposed in the peripheral area NDA but is not covered by the black matrix BM. Thus, the fourth reinforcing area Gc4g can display green color.

Therefore, since the green pixel columns disposed in the upper left area LHG include a plurality of reinforcing areas disposed outside the display area DA with respect to the imaginary boundary line BL, an ideal or improved perceived curvature can be realized by adjusting the slopes of the boundary lines between the green pixel columns and the black matrix BM. In addition, since the reinforcing areas are disposed in the peripheral area NDA, the ideal or improved perceived curvature can be realized without a reduction in luminance.

Next, the slopes of the boundary lines between the red pixel columns and the black matrix BM will be described with reference to FIGS. 6, 7, 8, 9, and 10.

Referring to FIGS. 6, 7, 8, 9, and 10, in the case of the red pixel columns displaying red among the pixels arranged in the upper left area LHG, the slopes of the boundary lines between the red pixel columns and the black matrix BM reduce along the first direction d1.

For example, the second red boundary slope ra2 in the second area G2a is smaller than the first red boundary slope ra1 in the first area G1a. In addition, the third red boundary slope ga3 in the third area G3a may have a negative value. That is, the slopes of the boundary lines between the red pixel columns and the black matrix BM may be varied to a negative value between the second area G2a and the third area G3a. Further, the fourth red boundary slope ra4 in the fourth area G4a may maintain a negative value, but its absolute value may be larger than that of the third red boundary slope ra3.

That is, since the slopes of the tangent lines to the imaginary boundary line BL reduce along the first direction d1 in the first area G1a and the second area G2a, the slopes of the boundary lines between the red pixel columns and the black matrix BM also reduce along the first direction d1 in the first area G1a and the second area G2a in proportion to the slopes of the tangent lines to the imaginary boundary line BL. That is, an ideal or improved perceived curvature can be realized by adjusting the slopes of the boundary lines between the red pixel columns and the black matrix BM.

The slopes of the boundary lines between the red pixel columns and the black matrix BM may be varied from a positive value to a negative value along the first direction d1. Accordingly, the luminance of the blue pixel columns disposed in the upper left area LHG can be reinforced. This will be described later.

The red pixel columns disposed in the upper left area LHG may include a plurality of reinforcing areas to adjust the slopes of the boundary lines between the red pixel columns and the black matrix BM.

More specifically, the third red pixel column c3r may include a first reinforcing area Gc3r disposed outside the display area DA (i.e., in the peripheral area NDA) with respect to the imaginary boundary line BL. The first reinforcing area Gc3r is disposed in the peripheral area NDA but is not covered by the black matrix BM. Thus, the first reinforcing area Gc3r can display red color.

The fourth red pixel column c4r may include a second reinforcing area Gc4r disposed outside the display area DA (i.e., in the peripheral area NDA) with respect to the imaginary boundary line BL. The second reinforcing area Gc4r is disposed in the peripheral area NDA but is not covered by the black matrix BM. Thus, the second reinforcing area Gc4r can display red color.

In FIG. 6, the first red pixel column c1r does not include a reinforcing area which is disposed in the peripheral area NDA but is not covered by the black matrix BM. On the other hand, the black matrix BM is disposed inside the display area DA with respect to the imaginary boundary line BL. Thus, the black matrix BM is blocks at least a part of the first red pixel column c1r in the display area DA adjacent to the imaginary boundary line BL. However, the exemplary embodiments are not limited to this case. That is, the first red pixel column cr1 disposed in the first area G1a can include the reinforcing area.

In FIG. 7, the second red pixel column c2r does not include a reinforcing area which is disposed in the peripheral area NDA but is not covered by the black matrix BM. On the other hand, the black matrix BM is disposed inside the display area DA with respect to the imaginary boundary line BL. Thus, the black matrix BM is blocks at least a part of the second red pixel column c2r in the display area DA adjacent to the imaginary boundary line BL. However, the exemplary embodiments are not limited to this case. That is, the second red pixel column cr2 disposed in the second area G2a can include the reinforcing area.

Therefore, since the red pixel columns disposed in the upper left area LHG include a plurality of reinforcing areas, an ideal or improved perceived curvature can be realized by adjusting the slopes of the boundary lines between the red pixel columns and the black matrix BM. In addition, since the reinforcing areas are disposed in the peripheral area NDA, the ideal or improved perceived curvature can be realized without a reduction in luminance.

The slopes of the boundary lines between the red pixel columns and the black matrix BM may be varied from a positive value to a negative value along the first direction d1. Accordingly, the luminance of the blue pixel columns disposed in the upper left area LHG can be reinforced. This will be described later.

Next, the slopes of the boundary lines between the blue pixel columns and the black matrix BM will be described with reference to FIGS. 6, 7, 8, 9, and 12.

Referring to FIGS. 6, 7, 8, 9, and 12, the boundary slopes of the blue pixel columns displaying blue among the pixels arranged in the upper left area LHG may be substantially equal to the slopes of the tangent lines to the imaginary boundary line BL.

The contribution of blue color to luminance is relatively low as compared with red and green. The contribution of blue color to luminance may be about 10% or less in an exemplary embodiment. Therefore, the boundary slopes of the blue pixel columns may be formed substantially equal to the slopes of the tangent lines, and the luminance of the blue pixel columns may be reinforced using reinforcing areas included in pixel columns displaying other colors.

Reinforcing the luminance of the blue pixel columns will now be described in more detail with reference to FIG. 9.

The slopes of the boundary lines between the red pixel columns and the black matrix BM may be varied from a positive value to a negative value along the first direction d1. Accordingly, the reinforcing areas included in the red pixel columns may be symmetrical to the reinforcing areas included in the green pixel columns.

For example, the fourth blue pixel column c4b may be disposed between the fourth green pixel column c4g and a fifth red pixel column c5r in the fourth area G4a. The fourth green pixel column c4g may include the fourth reinforcing area Gc4g, and the fifth red pixel column c5r may include a fifth reinforcing area Gc5r. Here, since the boundary slope of the fifth red pixel column c5r has a negative value, the shape of the fifth reinforcing area Gc5r is generally symmetrical to the shape of the fourth reinforcing area Gc4g.

This can be expressed that a side of the fourth reinforcing area Gc4g close to the fourth blue pixel column c4b is higher than the other side of the fourth reinforcing area Gc4g and that a side Gc5r1 of the fifth reinforcing area Gc5r close to the fourth blue pixel column c4b is higher than the other side of the fifth reinforcing area Gc5r.

That is, in the display device according to the exemplary embodiment, the fifth reinforcing area Gc5r of the fifth red pixel column c5r and the fourth reinforcing area Gc4g of the fourth green pixel line c4g are formed to surround the fourth blue pixel column c4b. Therefore, the luminance of the fourth blue pixel column c4b can be reinforced.

Figure 13:
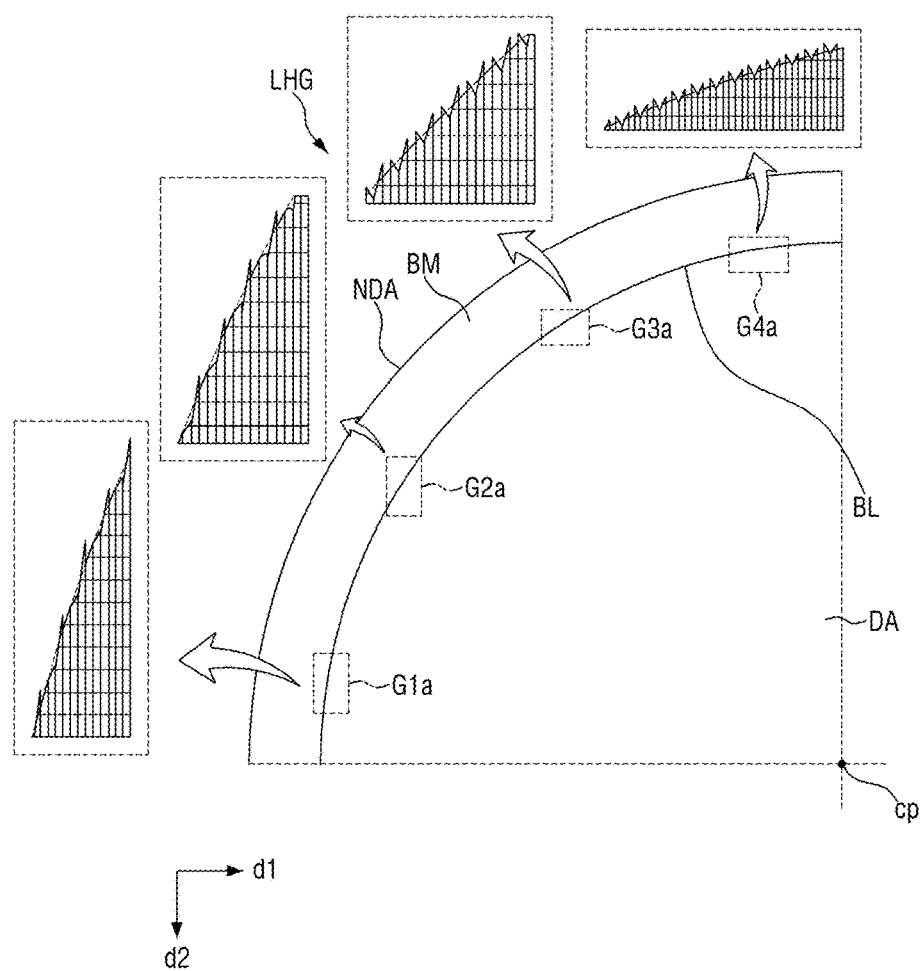
FIG. 13 illustrates the upper left area of FIG. 5 in more detail.

FIG. 13 illustrates the upper left area LHG of FIG. 5 in more detail.

That is, in the display device according to the exemplary embodiment, the slopes of the green pixel columns which highly contribute to luminance are formed to become gradually smaller along the first direction d1 in the upper left area LHG, thereby realizing an ideal or improved perceived curvature. In addition, in the display device according to the exemplary embodiment, the slopes of the red pixel columns are varied from a positive value to a negative value to reinforce the luminance of the blue pixel columns displaying blue which contribute little to luminance. Therefore, the display device according to the exemplary embodiment enables a user to perceive the circular display area DA as being close to a circular shape.

Next, the upper right area RHG of the display area DA will be described. For simplicity, a description of elements and features identical to those described above with reference to FIGS. 1, 2, 3, 4, 5, 6, 7, 8, 9, 10, 11, 12, and 13 will be omitted.

Figure 14:
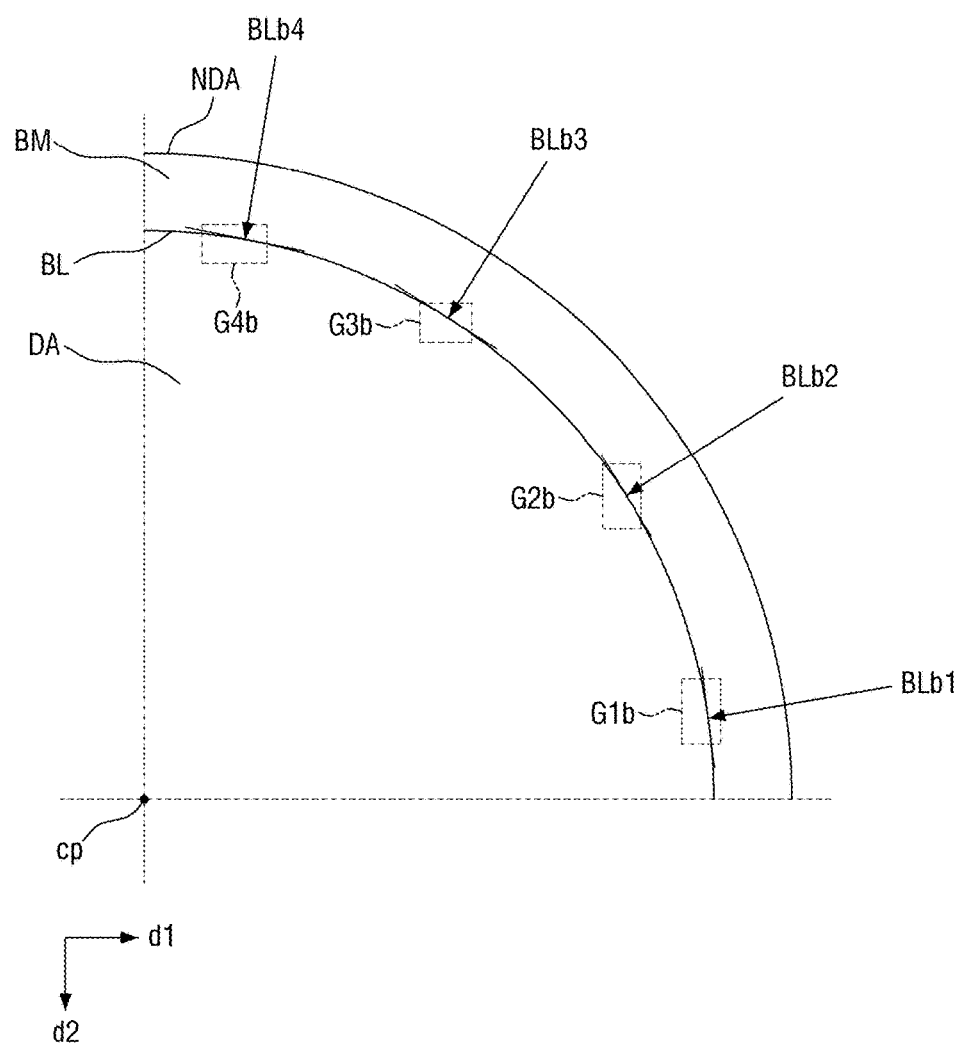
FIG. 14 is an enlarged view of an upper right area illustrated in FIG. 4.

FIG. 14 is an enlarged view of the upper right area RHG illustrated in FIG. 4.

Referring to FIG. 14, fifth, sixth, seventh, and eighth areas G1b, G2b, G2b, and G4b may be arranged in the upper right area RHG. The fifth, sixth, seventh, and eighth areas G1b, G2b, G2b, and G4b are defined as areas arranged sequentially along a direction opposite to the first direction d1 and overlapping the imaginary boundary line BL.

The upper right area RHG may not be symmetrical to the upper left area LHG in an exemplary embodiment. As described above, the pixels PX (see FIG. 1) may be arranged sequentially along the first direction d1 to display red, green and blue. Accordingly, the number of pixels displaying blue may be relatively larger in areas of the upper right area RHG which overlap the imaginary boundary line BL than in the upper left area LHG. This means that luminance reinforcement needs to be considered more in the upper right area RHG than in the upper left area LHG.

The boundary slope of each pixel column disposed in the fifth, sixth, seventh, and eighth areas G1b, G2b, G2b, and G4b will hereinafter be described with reference to FIGS. 15, 16, 17, 18, 19, 20, 21, and 22. Since the boundary slopes and the slopes of tangent lines to the imaginary boundary line BL in the upper right area RHG have negative values, their absolute values will be used.

Figure 15:
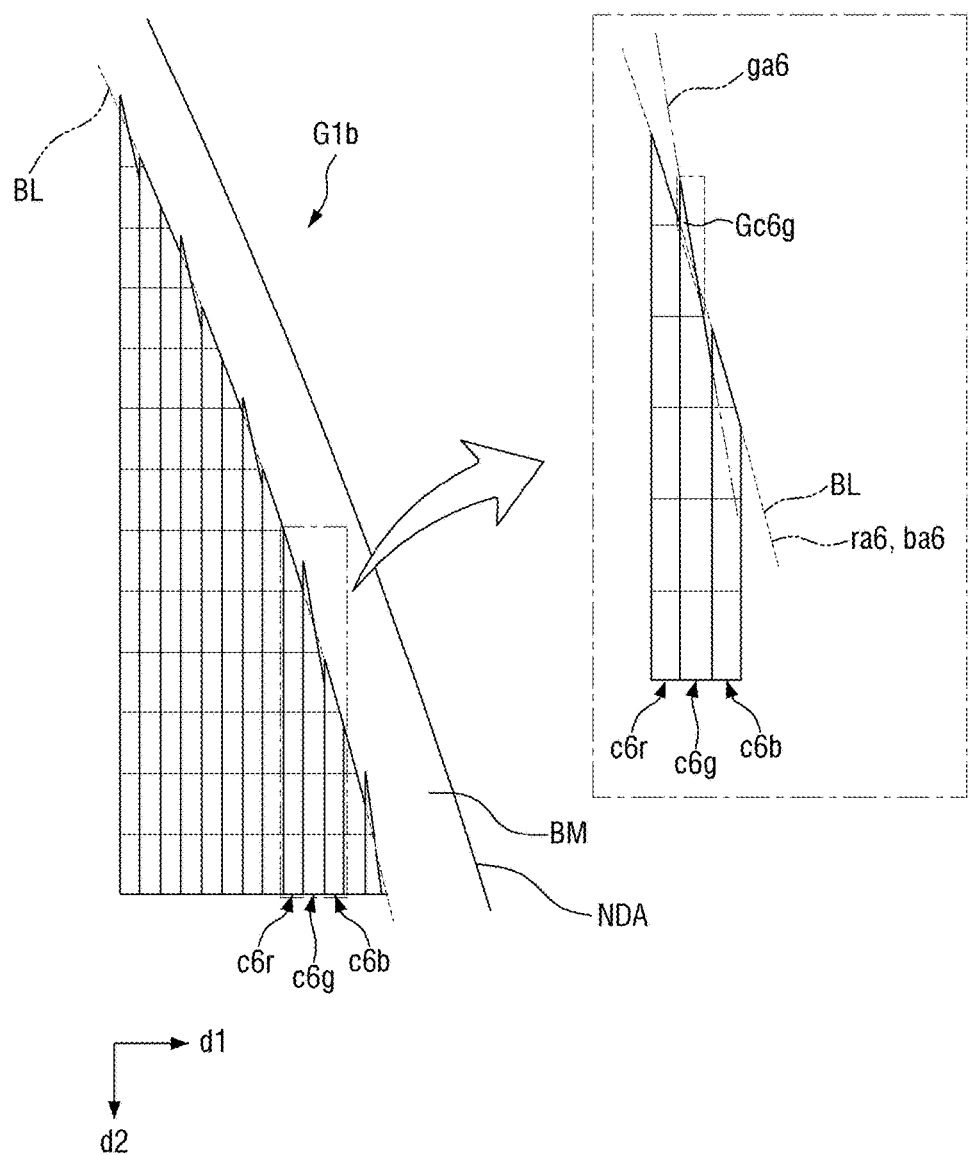
FIG. 15 is an enlarged view of a fifth area illustrated in FIG. 14.
Figure 16:
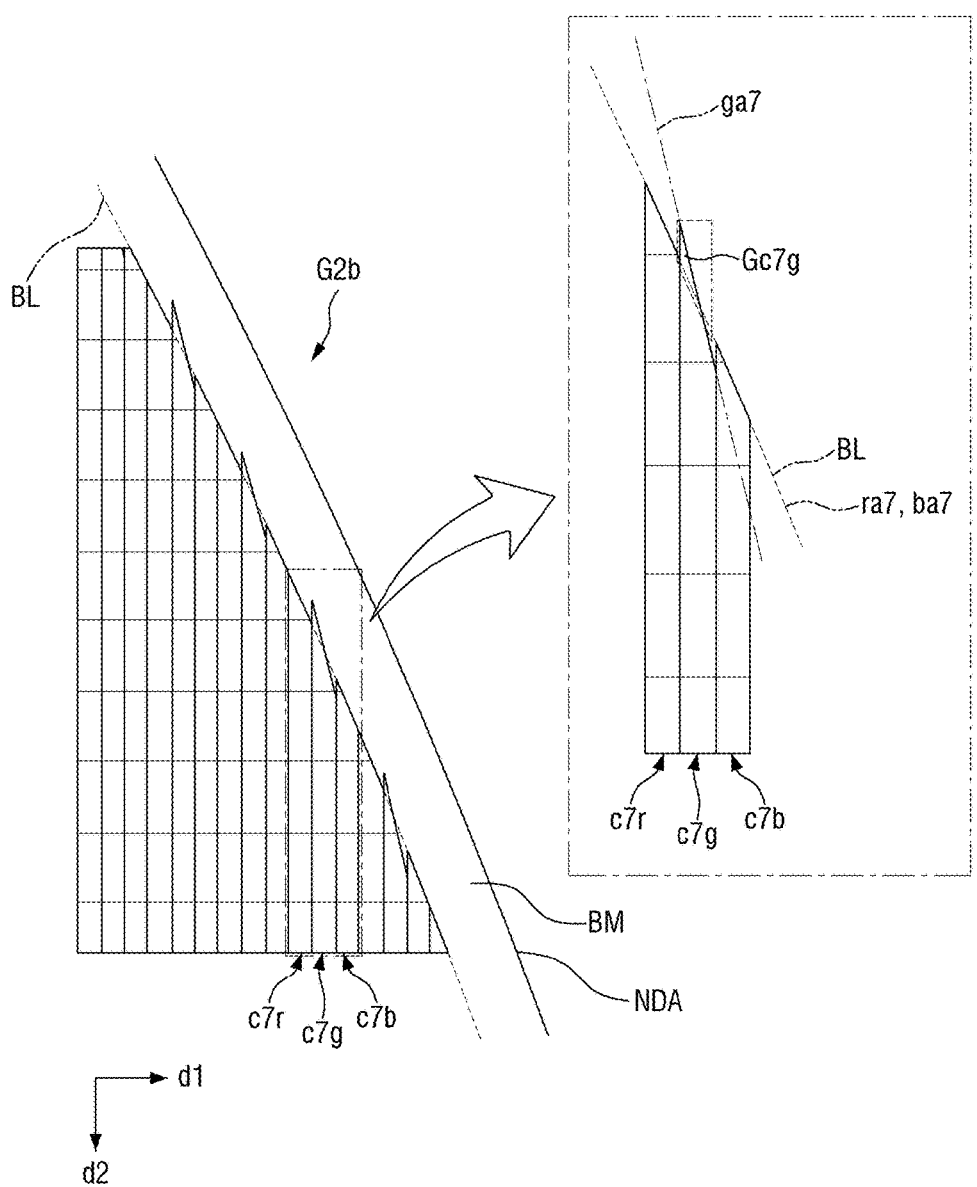
FIG. 16 is an enlarged view of a sixth area illustrated in FIG. 14.
Figure 17:
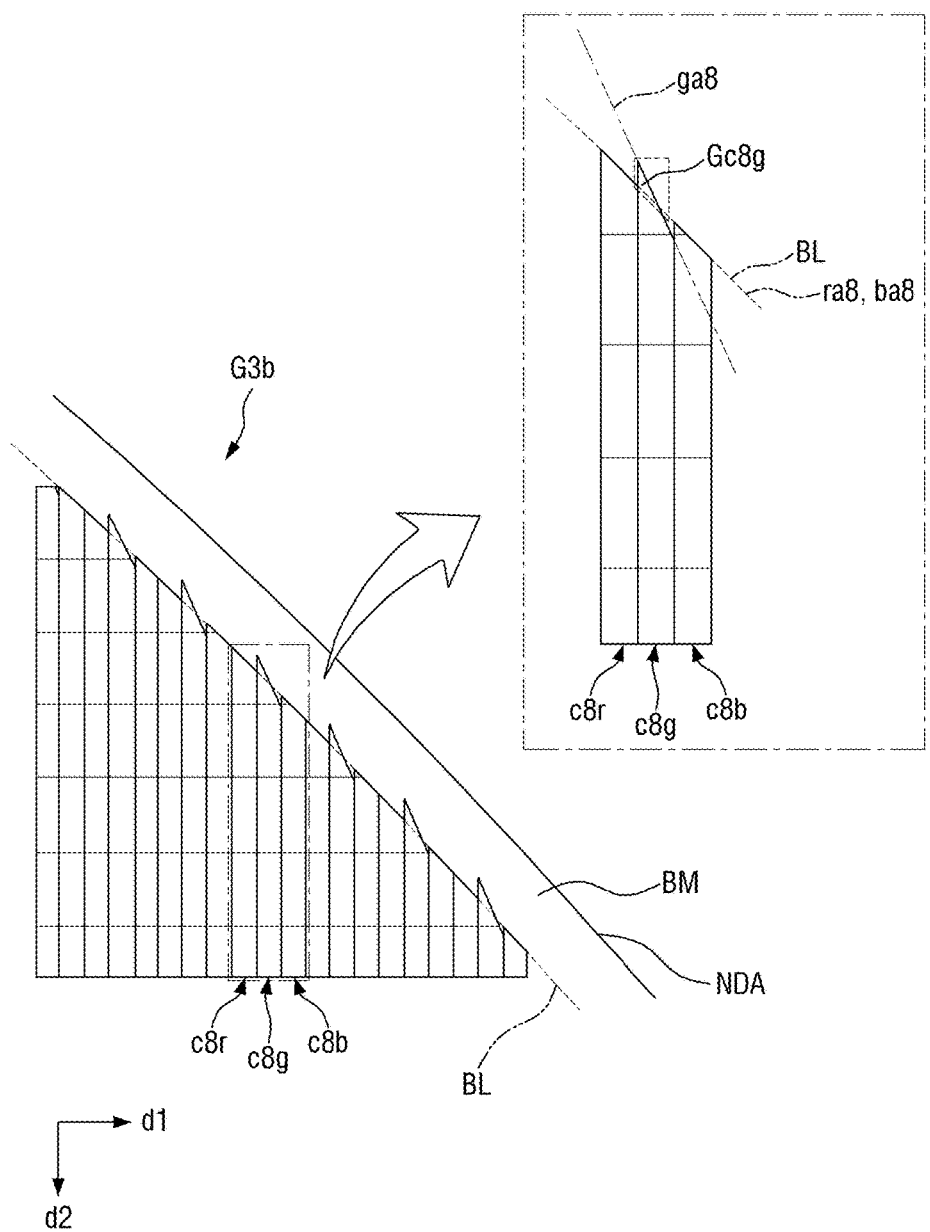
FIG. 17 is an enlarged view of a seventh area illustrated in FIG. 14.
Figure 18:
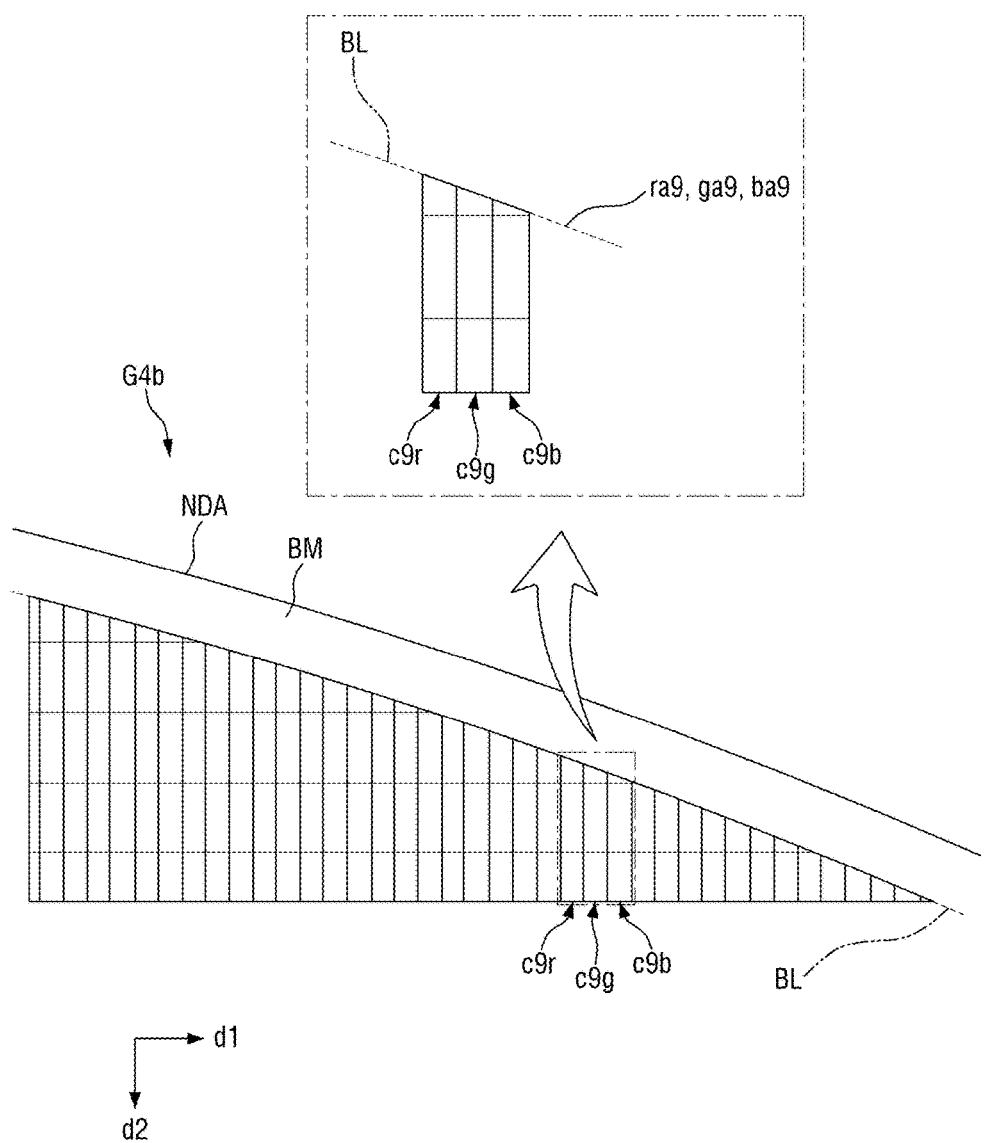
FIG. 18 is an enlarged view of an eighth area illustrated in FIG. 14.

FIG. 15 is an enlarged view of the fifth area G1b illustrated in FIG. 14. FIG. 16 is an enlarged view of the sixth area G2b illustrated in FIG. 14. FIG. 17 is an enlarged view of the seventh area G3b illustrated in FIG. 14. FIG. 18 is an enlarged view of the eighth area G4b illustrated in FIG. 14.

Figure 19:
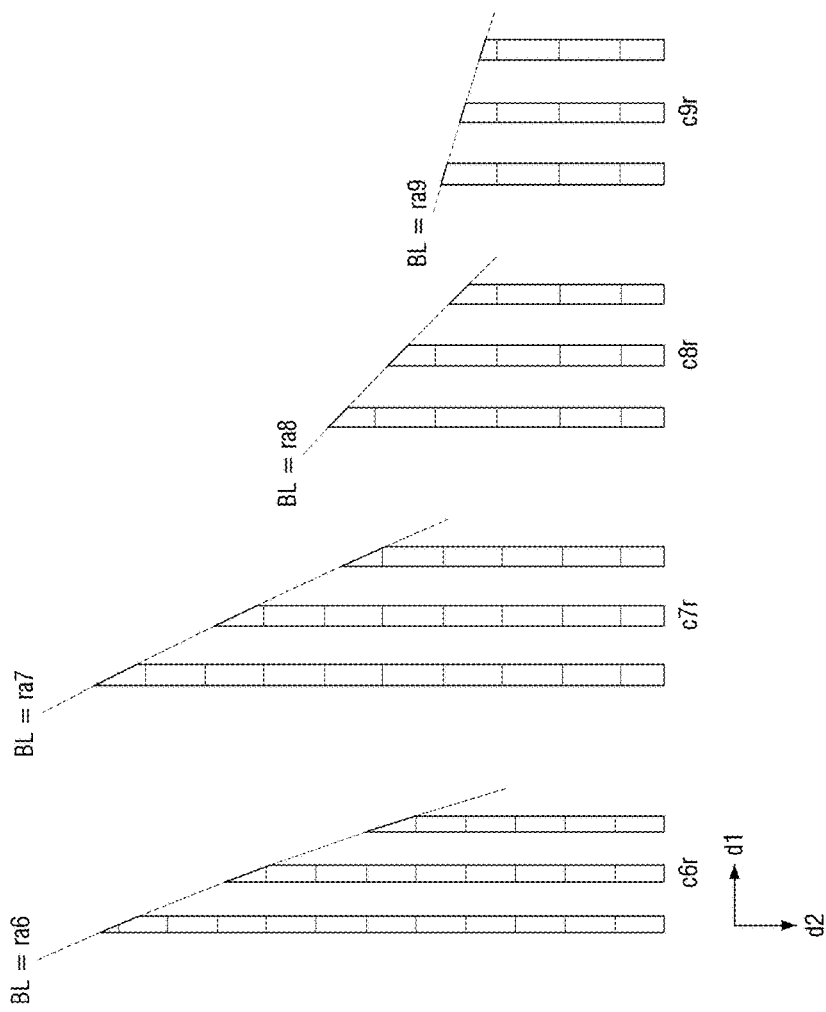
FIG. 19 illustrates red pixel columns among pixel columns arranged in the fifth, sixth, seventh, and eighth areas of FIGS. 15, 16, 17, and 18.
Figure 20:
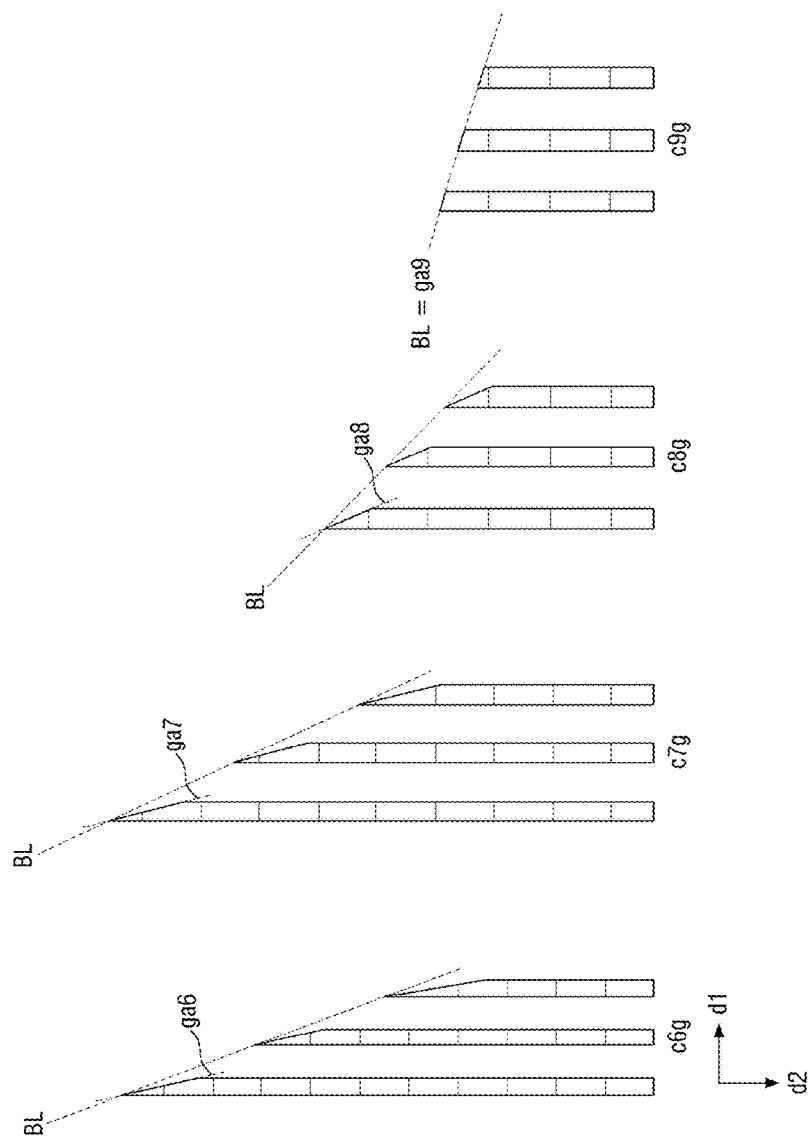
FIG. 20 illustrates green pixel columns among the pixel columns arranged in the fifth, sixth, seventh, and eighth areas of FIGS. 15, 16, 17, and 18.
Figure 21:
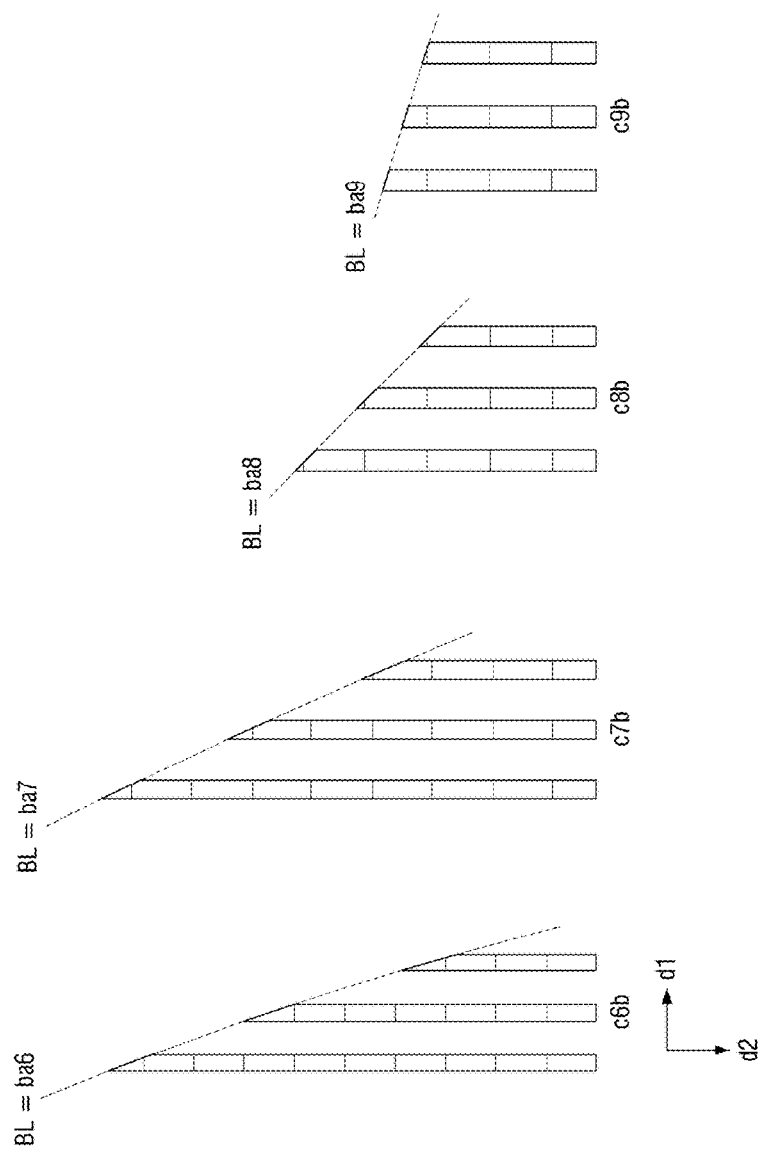
FIG. 21 illustrates blue pixel columns among the pixel columns arranged in the fifth, sixth, seventh, and eighth areas of FIGS. 15, 16, 17, and 18.
Figure 22:
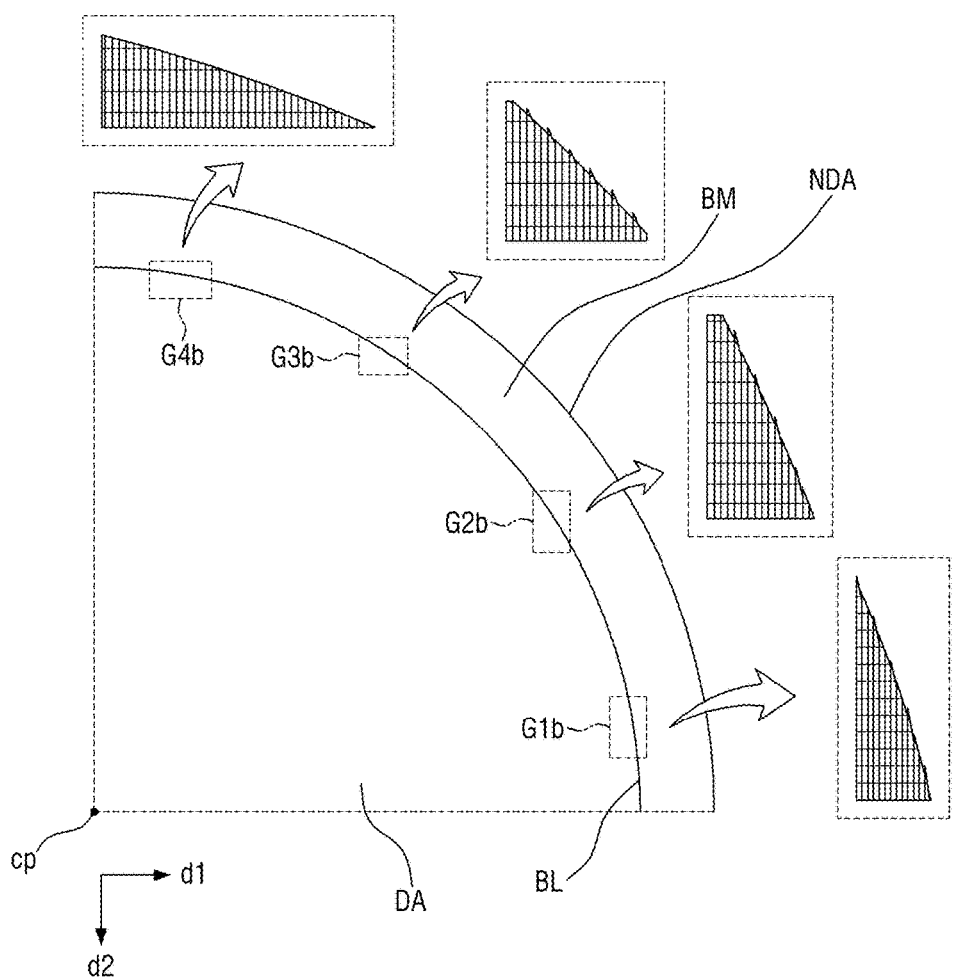
FIG. 22 illustrates the upper right area of FIG. 14 in more detail.

FIG. 19 illustrates red pixel columns among pixel columns arranged in the fifth, sixth, seventh, and eighth areas G1b, G2b, G2b, and G4b of FIGS. 15, 16, 17, and 18. FIG. illustrates green pixel columns among the pixel columns arranged in the fifth, sixth, seventh, and eighth areas G1b, G2b, G2b, and G4b of FIGS. 15, 16, 17, and 18. FIG. 21 illustrates blue pixel columns among the pixel columns arranged in the fifth, sixth, seventh, and eighth areas G1b, G2b, G2b, and G4b of FIGS. 15, 16, 17, and 18. FIG. 22 illustrates the upper right area RHG of FIG. 14 in more detail.

Referring to FIGS. 15, 16, 17, 18, 19, 20, 21, and 22, in the case of the upper right area RHG, the absolute values of the slopes of the tangent lines to the imaginary boundary line BL reduce along the direction opposite to the first direction d1, that is, from the fifth area G1b toward the eighth area G4b.

First, the green pixel columns will be described. In the case of the green pixel columns displaying green among a plurality of pixels arranged in the upper right area RHG, the absolute values of the slopes of boundary lines between the green pixel columns and the black matrix BM reduce along the direction opposite to the first direction d1.

For example, an absolute value of a seventh green boundary slope ga7 in the sixth area G2b is smaller than an absolute value of a sixth green boundary slope ga6 in the fifth area G1b. In addition, an absolute value of an eighth green boundary slope ga8 in the seventh area G3b is smaller than the absolute value of the seventh green boundary slope ga7 in the sixth area G2b. Further, an absolute value of a ninth green boundary slope ga9 in the eighth area G4b is smaller than the absolute value of the eighth green boundary slope ga8 in the seventh area G3b.

The ninth green boundary slope ga9 may be substantially the same with the slope of a tangent line to the imaginary boundary line BL in an exemplary embodiment. However, the exemplary embodiments are not limited thereto, and the ninth green boundary slope ga9 can be different from the slope of the tangent line to the imaginary boundary line BL.

That is, since the absolute values of the slopes of tangent lines to the imaginary boundary line BL reduce along the direction opposite to the first direction d1, the absolute values of the slopes of the boundary lines between the green pixel columns and the black matrix BM also reduce along the direction opposite to the first direction d1 in proportion to the absolute values of the slopes of the tangent lines to the imaginary boundary line BL. That is, an ideal or improved perceived curvature can be realized by adjusting the slopes of the boundary lines between the green pixel columns and the black matrix BM.

Referring to FIGS. 15, 16, 17, 18, 19, and 21, absolute values of sixth, seventh, eighth, and ninth red boundary slopes ra6, ra7, ra8, and ra9 of the red pixel columns c6r, c7r, c8r, and c9r and absolute values of sixth, seventh, eighth, and ninth blue boundary slopes ba6, ba7, ba8, and ba9 of the blue pixel columns c6b, c7b, c8b, and c9b disposed in the upper right area RHG may be substantially the same with the slope of a tangent line to the imaginary boundary line BL.

The green pixel columns disposed in the upper right area RHG may include a plurality of reinforcing areas to adjust the slopes of the boundary lines between the green pixel columns and the black matrix BM.

For example, a sixth green pixel column c6g may include a sixth reinforcing area Gc6g disposed outside the display area DA (i.e., in the peripheral area NDA) with respect to the imaginary boundary line BL. The sixth reinforcing area Gc6g is disposed in the peripheral area NDA but is not covered by the black matrix BM. Thus, the sixth reinforcing area Gc6g can display green color.

A seventh green pixel column c7g may include a seventh reinforcing area Gc7g disposed outside the display area DA (i.e., in the peripheral area NDA) with respect to the imaginary boundary line BL. The seventh reinforcing area Gc7g is disposed in the peripheral area NDA but is not covered by the black matrix BM. Thus, the seventh reinforcing area Gc7g can display green color.

An eighth green pixel column c8g may include an eighth reinforcing area Gc8g disposed outside the display area DA (i.e., in the peripheral area NDA) with respect to the imaginary boundary line BL. The eighth reinforcing area Gc8g is disposed in the peripheral area NDA but is not covered by the black matrix BM. Thus, the eighth reinforcing area Gc8g can display green color.

A ninth boundary slope ga9 of a ninth green pixel column c9g may be substantially the same with the slope of a tangent line to the imaginary boundary line BL. Thus, the ninth green pixel column c9g may not include a reinforcing area. Particularly, the black matrix may be formed to completely cover the part of the ninth green pixel column c9g that is disposed in the peripheral area NDA.

Therefore, since the green pixel columns disposed in the upper right area RHG include a plurality of reinforcing areas, an ideal or improved perceived curvature can be realized by adjusting the slopes of the boundary lines between the green pixel columns and the black matrix BM. In addition, since the reinforcing areas are disposed in the peripheral area NDA, the ideal or improved perceived curvature can be realized without a reduction in luminance.

Next, the red pixel columns will be described. The boundary slopes of the red pixel columns may be substantially equal to the slopes of the tangent lines to the imaginary boundary line BL. That is, even if the boundary slopes of the red pixel columns are formed substantially equal to the slopes of the tangent lines to the imaginary boundary line BL, since a side of each red pixel column close to a blue pixel column is relatively high, the luminance of the blue pixel column can be reinforced without varying the slope of each red pixel column from a negative value to a positive value.

However, the exemplary embodiments are not limited thereto. In an exemplary embodiment, the boundary slopes of the red pixel columns may be varied from a negative value to a positive value along the direction opposite to the first direction d1 in the upper right area RHG.

The contribution of blue to luminance is relatively low as compared with red and green. The contribution of blue to luminance may be about 10% or less in an exemplary embodiment. Therefore, the boundary slopes of the blue pixel columns may be formed substantially equal to the slopes of the tangent lines, and the luminance of the blue pixel columns may be reinforced using reinforcing areas included in pixel columns displaying other colors.

That is, in the display device according to the exemplary embodiment, the absolute value of the slopes of the green pixel columns which highly contribute to luminance are formed to become gradually smaller along the direction opposite to the first direction d1 in the upper right area RHG, thereby realizing an ideal or improved perceived curvature.

The arrangement structure and shapes of pixel columns in the lower left area LLG may be symmetrical to those of the pixel columns in the upper left area LHG in an exemplary embodiment. In addition, the arrangement structure and shapes of pixel columns in the lower right area RLG may be symmetrical to those of the pixel columns in the upper right area RHG in an exemplary embodiment.

Figure 23:
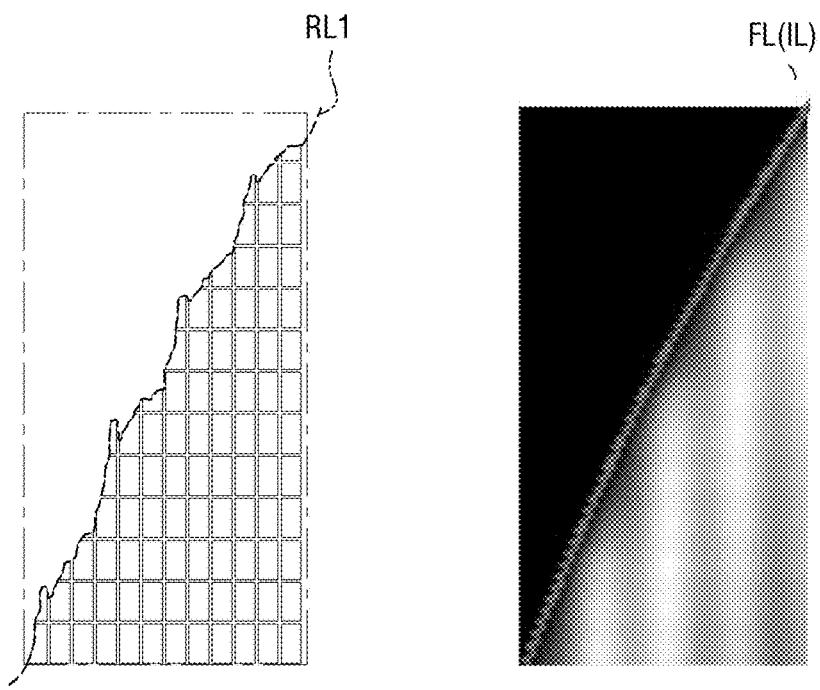
FIG. 23 illustrates an actual boundary line and a perceived boundary line of one area of the upper left area of the display device according to an exemplary embodiment.
Figure 24:
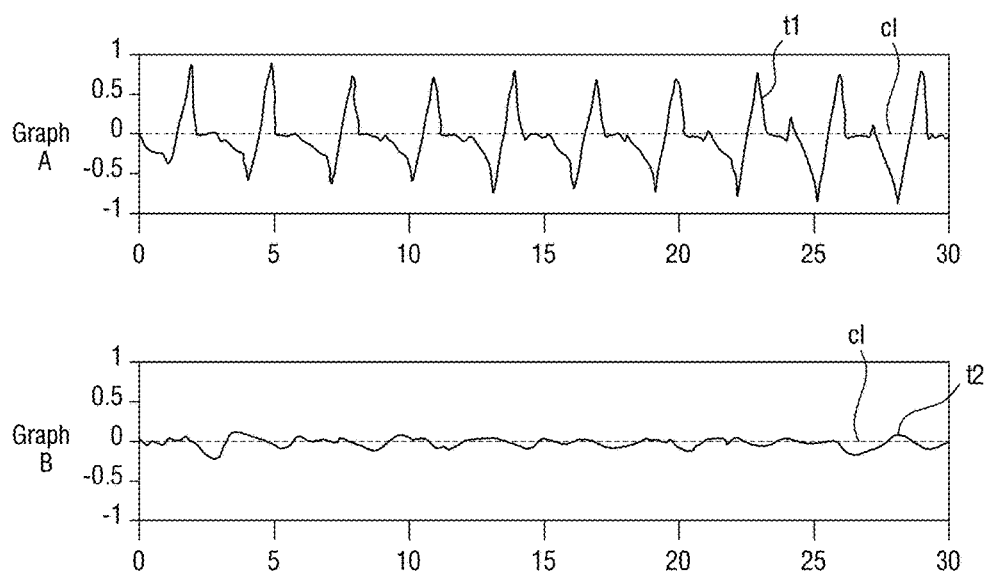
FIG. 24 includes a graph illustrating an actual luminance error according to the actual boundary line and a graph illustrating a perceived luminance error according to the perceived boundary line of FIG. 23.

FIG. 23 illustrates an actual boundary line RL1 and a perceived boundary line FL of one area of the upper left area LHG of the display device according to the exemplary embodiment. FIG. 24 includes a graph illustrating a luminance error at the actual boundary line RL1 and a graph illustrating a luminance error at the perceived boundary line FL of FIG. 23. Here, the luminance error is a value indicating the degree of deviation from a boundary line c1 having an ideal curvature.

Referring to FIG. 23, the actual boundary line RL1 of the display device according to the exemplary embodiment does not correspond with the boundary line c1 having the ideal curvature of the circular display area DA (see FIG. 4) as described above. Referring to Graph A of FIG. 24, the degree of deviation t1 of the actual boundary line RL1 of FIG. 23 from the boundary line c1 having the ideal curvature may be in the range of about −0.5 to +0.8.

On the other hand, the perceived boundary line FL of the display device according to the exemplary embodiment may be substantially the same as the ideal curvature IL of the circular display area DA (see FIG. 4). Referring to Graph B of FIG. 24, the degree of deviation $5i$ t2 of the perceived boundary line FL of FIG. 23 from the boundary line c1 having the ideal curvature may be in the range of about −0.2 to +0.2.

That is, in the display device according to the exemplary embodiment, the perceived boundary line FL may be formed substantially close to the boundary line c1 having the ideal curvature by forming the actual boundary line RL1 not to correspond with the boundary line c1 having the ideal curvature. That is, by mitigating the staircase effect and realizing the ideal or improved perceived curvature, the display device according to the exemplary embodiment enables a user to perceive the circular display area DA as being close to a circular shape.

Figure 25:
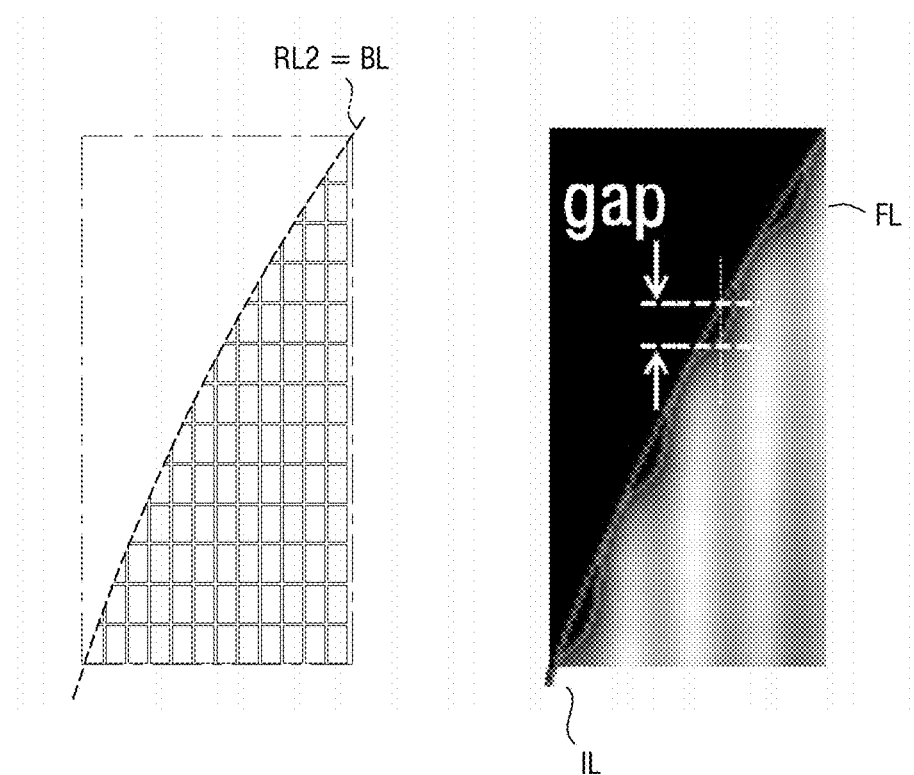
FIG. 25 illustrates an actual boundary line and a perceived boundary line of one area of an upper left area of a conventional display device.
Figure 26:
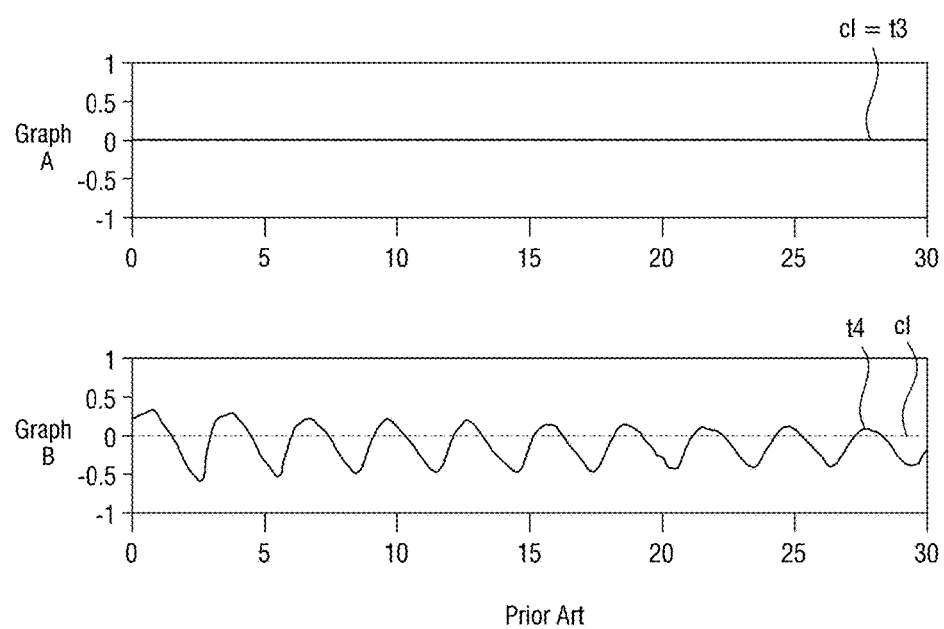
FIG. 26 is a graph illustrating an actual luminance error according to the actual boundary line and a perceived luminance error according to the perceived boundary line according to the conventional display device of FIG. 25.

FIG. 25 illustrates an actual boundary line RL2 and a perceived boundary line FL of one area of an upper left area of a conventional display device. FIG. 26 is a graph illustrating an actual luminance error according to the actual boundary line RL2 and a graph illustrating a perceived luminance error according to the perceived boundary line FL according to the conventional display device of FIG. 25. For simplicity, a description of elements and features identical to those described above with reference to FIGS. 23 and 24 will be omitted.

Referring to FIG. 25, the actual boundary line RL2 of the conventional display device may be the same as an ideal curvature BL of a circular display area. Referring to graph A of FIG. 26, the actual boundary line RL2 in FIG. 25A may be substantially the same as a boundary line c1 having an ideal curvature, and therefore the degree of deviation t3 of the actual boundary line RL2 from the boundary line c1 is 0.

On the other hand, the perceived boundary line FL of the conventional display device has a certain gap from an ideal curvature IL of the circular display area. Referring to graph B of FIG. 26, the degree of deviation t4 of the perceived boundary line FL in FIG. 25B from the boundary line c1 having the ideal curvature may be in the range of about −0.6 to +0.4. This means that although the display area is actually circular, a user may not perceive the display area as being circular.

Figure 27:
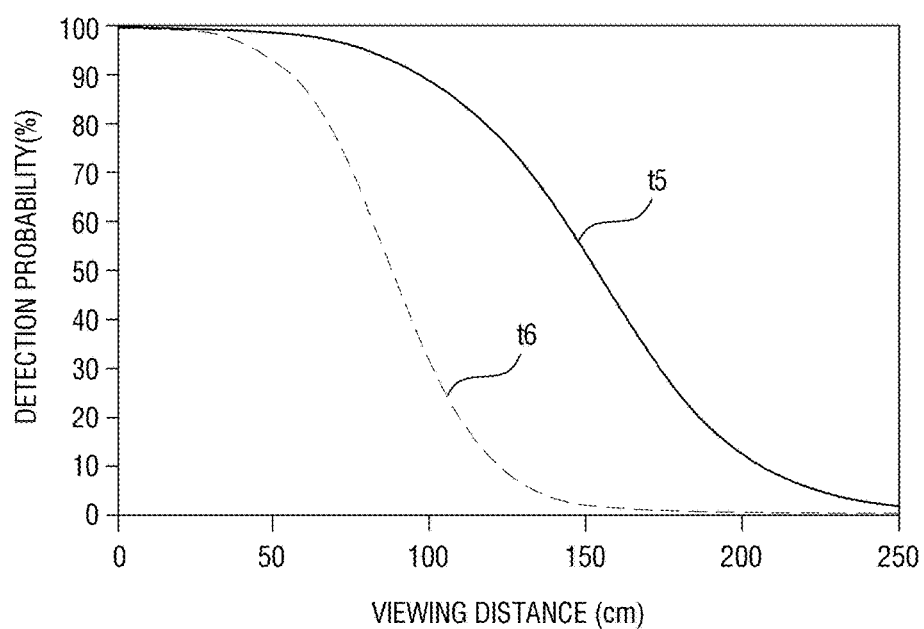
FIG. 27 is a graph illustrating the probability of detecting staircase effect with respect to the viewing distance in the display device according to an exemplary embodiment.

FIG. 27 is a graph illustrating the probability of staircase effect detection with respect to the viewing distance in the display device according to an exemplary embodiment. In FIG. 27, the line t5 represents a conventional display device, and the line t6 represents the display device according to the exemplary embodiment.

Referring to FIG. 27, it can be seen that the display device according to the exemplary embodiment has a lower probability of staircase effect detection than that of the conventional display device based on the same viewing distance. Table 1 below shows the results of experiments on staircase effect non-perception distances of the display device according to the exemplary embodiment and the conventional display device. Here, the graph of FIG. 27 and Table 1 show the results of experiments conducted based on a 55-inch UHD TV.

TABLE 1

|  | Conventional display device | display device of exemplary embodiment | Improvement rate |
| --- | --- | --- | --- |
| Left | 111 cm | 75 cm | 32% |
| Right | 152 cm | 88 cm | 42% |

Referring to Table 1, the minimum distance that the user may not perceive the staircase effect of the display device according to the exemplary embodiment is 75 cm from a left side of the display device and 88 cm from a right side of the display device. On the other hand, the minimum distance that the user may not perceive the staircase effect of the conventional display device is 111 cm from the left side of the display device and 152 cm from the right side of the display device. This indicates that the staircase effect is less likely to be perceived in the display device according to the exemplary embodiment than in the conventional display device.

Figure 28:
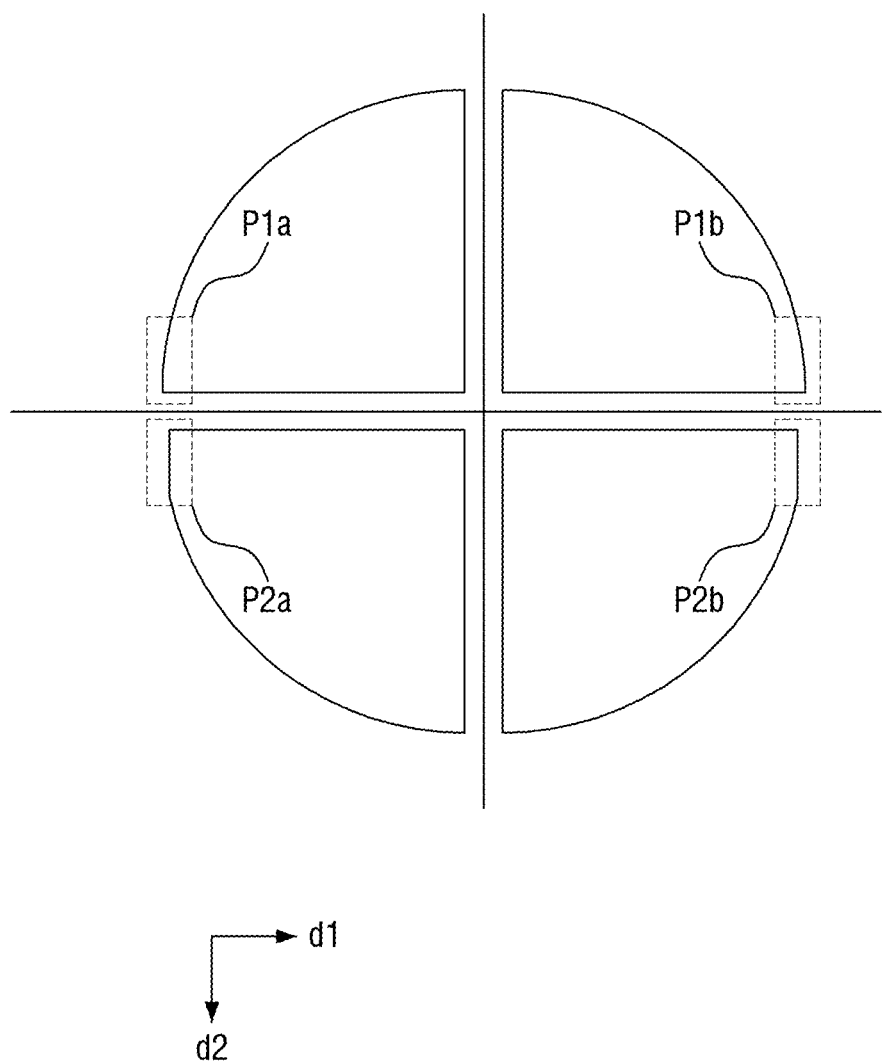
FIG. 28 is a diagram for explaining the completeness of an ideal or improved perceived curvature in the display device according to an exemplary embodiment in comparison with a conventional display.

FIG. 28 is a diagram for explaining the completeness of an ideal or improved perceived curvature in the display device according to the exemplary embodiment. The top half of FIG. 28 illustrates a perceived boundary line of the display device according to the exemplary embodiment, and the bottom half of FIG. 28 illustrates a perceived boundary line of a conventional display device.

Referring to FIG. 28, a first area P1$a$ is perceived to have a curvature relatively closer to a circle than a second area P2$a$. In addition, a third area P1$b$ is relatively closer to a curve than a fourth area P2$b$.

That is, in areas P2$a$ and P2$b$ of FIG. 28, even if a boundary line is formed according to an actual ideal curvature, a part of the second area P2$a$ is perceived as being straight due to a staircase effect caused by a difference in luminance of pixels. On the other hand, in areas P1$a$ and P1$b$ of FIG. 28, a boundary line is deliberately formed to be different from the actual ideal curvature in consideration of the difference in the luminance of the pixels and the arrangement of the pixels. Therefore, the first area P1$a$ and the third area P1$b$ can be perceived as being relatively close to a circular shape.

Figure 29:
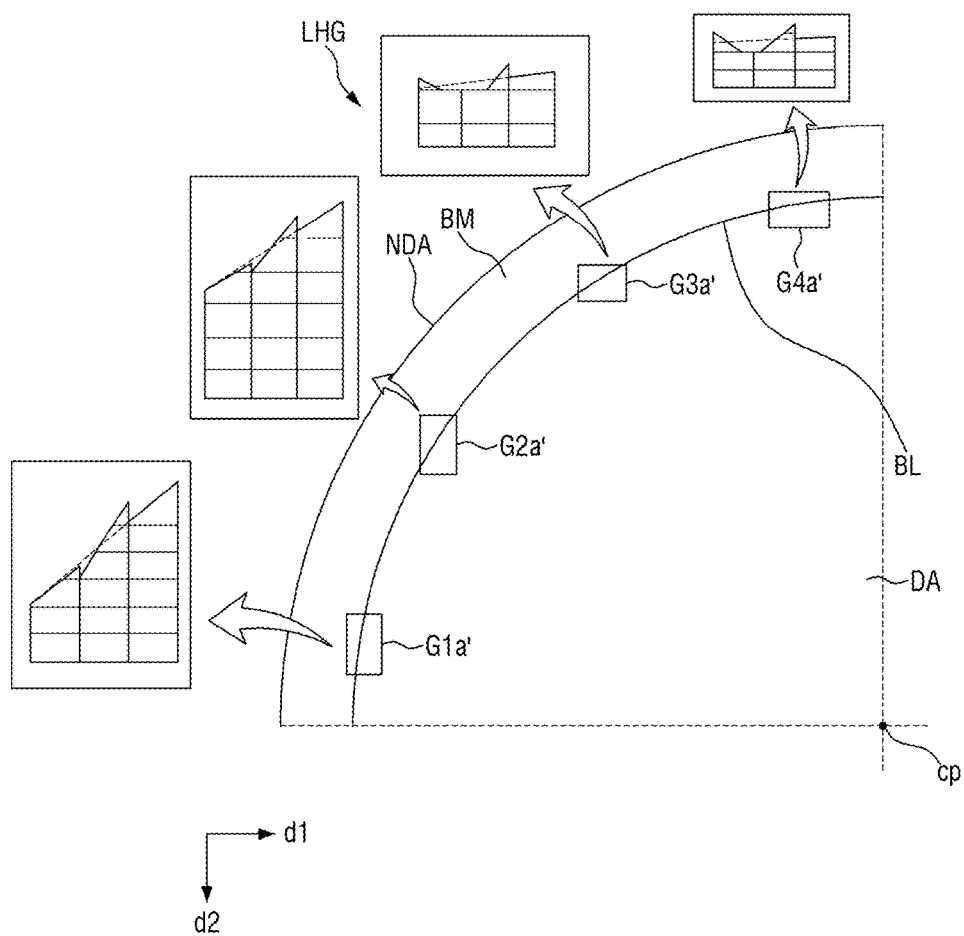
FIG. 29 is a partial view of a display area of a display device according to an exemplary embodiment.

FIG. 29 is a partial view of a display area of a display device according to an exemplary embodiment. For simplicity, a description of elements and features identical to those described above with reference to FIGS. 1 through 28 will be omitted.

Referring to FIG. 29, the display device according to the exemplary embodiment may include a plurality of pixels extending a longer distance in the first direction d1 than in the second direction d2. That is, the display device according to the exemplary embodiment may include a plurality of pixels having a horizontal pixel structure.

Even in this case, an ideal or improved perceived curvature can be realized by varying boundary slopes in first, second, third, and fourth areas G1$a'$, G2$a'$, G3$a'$ and G4$a'$ according to slopes of tangent lines to an imaginary boundary line BL.

According to embodiments, a staircase effect can be reduced.

In addition, a display device can be perceived as being closer to a circular shape by a user.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display device comprising:
a display area;
a peripheral area disposed outside the display area and in which at least a part of a black matrix is disposed; and
a plurality of pixel columns comprising:
a first pixel column configured to display a first color, the first pixel column comprising a first boundary slope defined by a boundary line between the first pixel column and the black matrix; and
a second pixel column disposed adjacent to the first pixel column, the second pixel column configured to display a second color different from the first color and comprising a second boundary slope defined by a boundary line between the second pixel column and the black matrix,
wherein the first boundary slope has a positive value, and the second boundary slope has a negative value.

2. The display device of claim 1, wherein the first color is green.

3. The display device of claim 1, wherein the second color is red.

4. The display device of claim 1, wherein a circular boundary line is defined between the display area and the peripheral area,
wherein the first pixel column comprises a first area disposed in the peripheral area, and
wherein the black matrix does not overlap at least a part of the first area.

5. The display device of claim 1, wherein the plurality of pixel columns further comprises:
a third pixel column configured to display a third color different from the first color and the second color, the third pixel column comprising a third boundary slope defined by a boundary line between the first pixel column and the black matrix,
wherein the third pixel column is disposed between the first pixel column and the second pixel column.

6. The display device of claim 5, wherein the third color is blue.

7. The display device of claim 1, wherein the plurality of pixel columns further comprises:
a fourth pixel column configured to display the first color; and
a fifth pixel column disposed adjacent to the fourth pixel column and configured to display the second color.

8. The display device of claim 7, wherein the fourth pixel column comprises a fourth boundary slope defined by a boundary line between the fourth pixel column and the black matrix, and
wherein the fourth boundary slope is different from the first boundary slope.

9. The display device of claim 7, wherein the fifth pixel column comprises a fifth boundary slope defined by a boundary line between the fifth pixel column and the black matrix, and
wherein the fifth boundary slope has a positive value.

10. The display device of claim 1, wherein each of the plurality of pixel columns comprises pixels disposed in a first direction,
wherein each of the pixels comprising:
a first side extending in the first direction; and
a second side extending in a second direction intersecting the first direction, and
wherein the first side is longer than the second side.

11. A display device comprising:
a display area;
a peripheral area disposed outside the display area and in which at least a part of a black matrix is disposed; and
a plurality of pixel columns comprising:
a first pixel column comprising a first boundary slope defined by a boundary line between the first pixel column and the black matrix;
a second pixel column comprising a second boundary slope defined by a boundary line between the second pixel column and the black matrix; and
a third pixel column comprising a third boundary slope defined by a boundary line between the third pixel column and the black matrix,
wherein the first pixel column, the second pixel column, and the third pixel column are disposed adjacent to each other and configured to different colors,
wherein the first boundary slope, the second boundary slope, and the third boundary slope are different from each other.

12. The display device of claim 11, wherein the first pixel column is configured to display red, the second pixel column is configured to display green, and the third pixel column is configured to display blue.

13. The display device of claim 12, wherein the first boundary slope has a negative value, and the second boundary slope has a positive value.

14. The display device of claim 12, wherein an absolute value of the third boundary slope is smaller than those of the first and second boundary slopes.

15. The display device of claim 12, wherein a circular boundary line is defined between the display area and the peripheral area,
wherein the first pixel column comprises a first area disposed in the peripheral area, and
wherein the black matrix does not overlap at least a part of the first area.

16. The display device of claim 15, wherein the second pixel column comprises a second area disposed in the peripheral area, and
wherein the black matrix does not overlap at least a part of the second area.

17. The display device of claim 15, wherein the third pixel column comprises a third area disposed in the peripheral area, and
wherein the black matrix completely overlaps the third area.

18. The display device of claim 15, wherein the third boundary slope is substantially the same as a slope of the circular boundary line.

19. The display device of claim 12, wherein the plurality of pixel columns further comprises:

a fourth pixel column comprising a fourth boundary slope defined by a boundary line between the fourth pixel column and the black matrix;

a fifth pixel column comprising a fifth boundary slope defined by a boundary line between the fifth pixel column and the black matrix; and a sixth pixel column comprising a sixth boundary slope defined by a boundary line between the sixth pixel column and the black matrix;

wherein the fourth pixel column, the fifth pixel column, and the sixth pixel column are disposed adjacent to the first pixel column, the second pixel column, and the third pixel column, and the fourth pixel column, the fifth pixel column, and the sixth pixel column are configured to display different colors, and wherein at least two of the fourth boundary slope, the fifth boundary slope, and the sixth boundary slope are different from each other.

20. The display device of claim 19, wherein the fourth pixel column is configured to display red, wherein the first boundary slope has a negative value, and wherein the fourth boundary slope has a positive value.

* * * * *